US010678986B1

(12) United States Patent
Jaklic

(10) Patent No.: US 10,678,986 B1
(45) Date of Patent: Jun. 9, 2020

(54) METHODS FOR PERFORMING BOOLEAN OPERATIONS ON PLANAR REGION BOUNDARIES DEFINED BY PARAMETRIC CURVES

(71) Applicant: Cadence Design Systems, Inc., San Jose, CA (US)

(72) Inventor: Janez Jaklic, Feldkirchen (DE)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 16/165,973

(22) Filed: Oct. 19, 2018

(51) Int. Cl.
   G06F 17/50    (2006.01)
   G06F 30/39    (2020.01)
   G03F 1/26     (2012.01)
   G06T 11/20    (2006.01)

(52) U.S. Cl.
   CPC ............ *G06F 30/39* (2020.01); *G03F 1/26* (2013.01); *G06T 11/203* (2013.01)

(58) Field of Classification Search
   USPC .... 716/50, 51, 52, 53, 54, 55, 108, 115, 129
   See application file for complete search history.

(56) References Cited

U.S. PATENT DOCUMENTS

| | | | | |
|---|---|---|---|---|
| 7,346,886 | B2 * | 3/2008 | Fukagawa | G03F 7/70433 |
| | | | | 716/50 |
| 2003/0065494 | A1 | 4/2003 | Croix | |
| 2003/0083764 | A1 * | 5/2003 | Hong | G05B 19/40932 |
| | | | | 700/98 |
| 2006/0230365 | A1 * | 10/2006 | Bromberger | G06F 17/5063 |
| | | | | 716/115 |
| 2007/0226668 | A1 * | 9/2007 | Dasdan | G06F 17/5031 |
| | | | | 716/108 |
| 2008/0024499 | A1 | 1/2008 | Bateman | |
| 2009/0324093 | A1 | 12/2009 | Miarecki et al. | |
| 2011/0022219 | A1 * | 1/2011 | Saied | G03F 1/36 |
| | | | | 700/121 |
| 2012/0017193 | A1 * | 1/2012 | Ou | G06F 17/5068 |
| | | | | 716/129 |

(Continued)

OTHER PUBLICATIONS

Li, et al., "Global Topical Change of Offset Domains", Jun. 2011, IEEE, 2011, Eigth Internal Symposium on Voronoi Diagrams in Science and Engineering, Technical Digest, pp. 83-90.

*Primary Examiner* — Brian Ngo
(74) *Attorney, Agent, or Firm* — Vista IP Law Group, LLP

(57) ABSTRACT

A method includes receiving a first list including a plurality of first curves defining a first boundary set and a second list including a plurality of second curves defining a second boundary set. The first and second curves are indicative of features in an integrated circuit based on parametric values. The method includes determining intersections between pairs of curves from the first and the second lists, assigning a node to each intersection point of a pair of curves, and determining curve sections between the intersection points for each intersected curve. The method includes determining a successor of each curve section, determining boundaries formed by the curve sections, performing the Boolean operation between the boundaries to obtain the one or more features in the integrated circuit from the two or more boundaries, and generating a layout of the integrated circuit including the features for manufacturing a mask for reproducing the features.

20 Claims, 14 Drawing Sheets

(56) References Cited

U.S. PATENT DOCUMENTS

2014/0321165 A1\* 10/2014 Albea Sanchez ..... G06F 1/3206
363/1
2018/0239860 A1 8/2018 Allen \* cited by examiner

←604

←606

(b3∩b4)\(b5∪b6)

$((b3 \cap b4) \setminus (b5 \cup b6)) \cup b7 \cup b8 \cup b9 \cup b10$

METHODS FOR PERFORMING BOOLEAN OPERATIONS ON PLANAR REGION BOUNDARIES DEFINED BY PARAMETRIC CURVES

TECHNICAL FIELD

Embodiments described herein are generally related to the field of design and fabrication of integrated circuits (ICs). More specifically, embodiments described herein are related to performing Boolean operations on planar region boundaries that are defined by parametric equations.

BACKGROUND

IC design and verification tools perform Boolean operations on polygonal boundaries of planar regions. For certain applications, however, the use of more general classes of shapes than polygons is required. For example, the shapes of silicon photonics, MEMS, microfluidics devices, and the like may be the result of the mathematical solution of some underlying physical model and therefore most naturally described by curves given by parametric curve functions (mathematical equations) in symbolic form. One way to perform Boolean operations on such boundaries using the existing methods (e.g., complementary metal oxide-semiconductor (CMOS) processes) is by approximating the curved boundaries to polygons. However, the existing methods result in loss of the mathematical information about the positions of various points on a curve, location of intersections of the curve with other curves, tangents and normal to the curve, curvature of the curve, derivative functions of the curve, and the like. Further, it is difficult to reconstruct the original mathematically defined curved boundaries after these have been approximated to polygons.

It is desirable to provide a method and a strategy for performing Boolean operations on mathematically described curved boundaries instead of converting the curved boundaries to polygons.

The description provided in the background section should not be assumed prior art merely because it is mentioned in or associated with the background section. The background section may include information that describes one or more aspects of the subject technology.

SUMMARY

In a first embodiment, a computer-implemented method includes receiving a first list including a plurality of first curves that define a first boundary set and receiving a second list including a plurality of second curves that define a second boundary set. The first and second curves are indicative of one or more features in an integrated circuit based on parametric values. The method includes determining intersections between pairs of curves from the first list and the second list, assigning a node to each intersection point of a pair of curves, determining curve sections between the intersection points for each intersected curve, determining, based on a desired Boolean operation, a successor of each curve section, determining boundaries formed by the curve sections, performing the desired Boolean operation between two or more boundaries to obtain the one or more features in the integrated circuit from the two or more boundaries, obtaining a layout of the integrated circuit including the one or more features in the integrated circuit, and providing the layout to manufacture a mask for reproducing the one or more features in the integrated circuit.

In a second embodiment, a system is disclosed that includes a non-transitory computer readable medium storing computer readable program code; and one or more processors configured to execute the computer readable program code to configure the system to receive a first list including a plurality of first curves that define a first boundary set and receive a second list including a plurality of second curves that define a second boundary set. The first and second curves are indicative of one or more features in an integrated circuit based on parametric values. The one or more processors further execute the computer readable program code to configure the system to determine intersections between pairs of curves from the first list and the second list, assign a node to each intersection point of a pair of curves, determine curve sections between the intersection points for each intersected curve, determine, based on a desired Boolean operation, a successor of each curve section, determine boundaries formed by the curve sections, perform the desired Boolean operation between two or more boundaries to obtain the one or more features in the integrated circuit from the two or more boundaries, and generate a layout of the integrated circuit including the one or more features in the integrated circuit, the layout being used to manufacture a mask for reproducing the one or more features in the integrated circuit.

In yet another embodiment, a non-transitory, machine-readable storage medium is disclosed that includes instructions which, when executed by a processor, cause a computer to perform a method. The method includes receiving a first list including a plurality of first curves that define a first boundary set and receiving a second list including a plurality of second curves that define a second boundary set. The first and second curves are indicative of one or more features in an integrated circuit based on parametric values. The method includes determining intersections between pairs of curves from the first list and the second list, assigning a node to each intersection point of a pair of curves, determining curve sections between the intersection points for each intersected curve, determining, based on a desired Boolean operation, a successor of each curve section, determining boundaries formed by the curve sections, performing the desired Boolean operation between two or more boundaries to obtain the one or more features in the integrated circuit from the two or more boundaries, generating a layout of the integrated circuit including the one or more features in the integrated circuit, the layout being used to manufacture a mask for reproducing the one or more features in the integrated circuit.

In a further embodiment, a system is disclosed that includes a means to store instructions and a means to execute the instructions to cause the system to perform a method. The method includes receiving a first list including a plurality of first curves that define a first boundary set and receiving a second list including a plurality of second curves that define a second boundary set. The first and second curves are indicative of one or more features in an integrated circuit based on parametric values. The method includes determining intersections between pairs of curves from the first list and the second list, assigning a node to each intersection point of a pair of curves, determining curve sections between the intersection points for each intersected curve, determining, based on a desired Boolean operation, a successor of each curve section, performing the desired Boolean operation between two or more boundaries to obtain the one or more features in the integrated circuit from the two or more boundaries, generating a layout of the integrated circuit including the one or more features in the integrated circuit, and providing the layout to manufacture a mask for reproducing the one or more features in the integrated circuit.

BRIEF DESCRIPTION OF THE DRAWINGS

The accompanying drawings, which are included to provide further understanding and are incorporated in and constitute a part of this specification, illustrate disclosed embodiments, and together with the description, serve to explain the principles of the disclosed embodiments. In the drawings.

Figure 1:
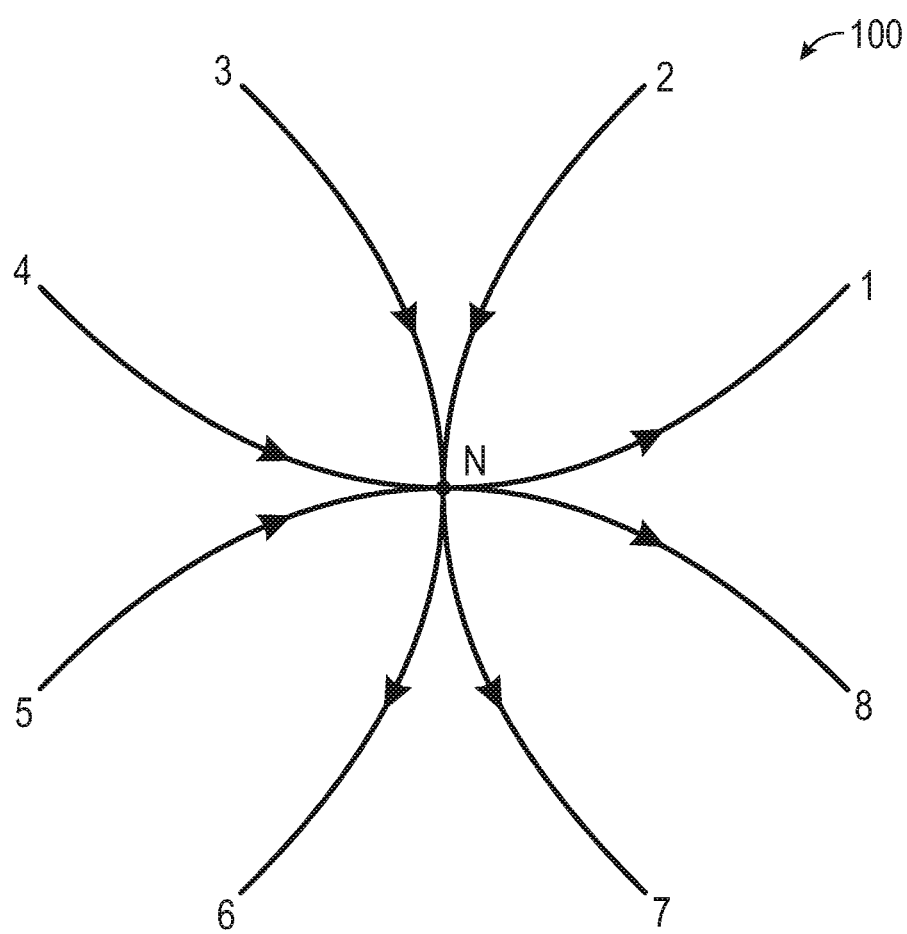
FIG. 1 illustrates an example system of curve sections.

In the figures, elements and steps denoted by the same or similar reference numerals are associated with the same or similar elements and steps, unless indicated otherwise. In one or more implementations, not all of the depicted components in each figure may be required, and one or more implementations may include additional components not shown in a figure. Variations in the arrangement and type of the components may be made without departing from the scope of the subject disclosure. Additional components, different components, or fewer components may be utilized within the scope of the subject disclosure.

DETAILED DESCRIPTION

The detailed description set forth below is intended as a description of various implementations and is not intended to represent the only implementations in which the subject technology may be practiced. As those skilled in the art would realize, the described implementations may be modified in various different ways, all without departing from the scope of the present disclosure. Accordingly, the drawings and descriptions are to be regarded as illustrative in nature and not restrictive.

General Overview

The disclosed methods address a deficiency tied to computer technology and arising in the realm of integrated circuit design, namely, the inability of existing integrated circuit (IC) layout design tools to perform Boolean operations directly on curves that form the curved boundaries of closed regions in the plane and are defined by parametric curve functions (or equations).

Silicon photonics generally is the study and application of photonic systems that use silicon as an optical medium. The silicon is patterned with sub-micrometer precision into silicon photonic devices. Silicon photonic devices, such as, optical wave guides, lasers, optical modulators, photodetectors, optical switches, and the like, require very precise curves to ensure that the structures perform as expected for a given wavelength of light. The geometries of such devices typically need to adhere to certain smoothness requirements or even be a mathematical solution of some underlying physical model, therefore they may not be satisfactorily described by any of the predefined classes of curves (e.g., straight lines) used in existing IC layout design tools. Instead, they may be described by planar parametric curves defined by parametric curve functions, for instance.

This is different than existing CMOS technology in which the electronic components are typically defined in terms of orthogonal shapes, e.g., polygons consisting of line segments. Thus, in order to create a layout using the existing methods, the curved boundaries of these devices are approximated to polygons. However, once the curve boundaries are approximated to polygons, it is not possible to reverse the process to obtain the original information of the curved boundaries, such as positions of various points on a curve, location of intersections of the curve with other curves, tangents and normal to the curve, curvature of the curve, and the like. In other words, the original information is considered lost.

Embodiments described therein are directed to performing the Boolean operations (e.g., union, intersection, difference, and the like) directly on the curved boundaries defined by parametric curve functions instead of converting the curved boundaries into polygons. As a result, the output of the Boolean operations is also defined by parametric curve functions. Stated otherwise, the curved boundaries resulting from the Boolean operations are described by parametric curve functions. An advantage of performing Boolean operations directly on the parametric curve functions is that the original information about the curved boundaries prior to the Boolean operations remains intact and can be obtained from the result.

As used herein, "curves", or variations thereof, may be defined in a parametric form given by $$c=r(t)=(x(t),y(t)), \text{ wherein } t_1 \le t \le t_2 \quad \text{Equation 1}$$

where r is a point on the curve in the plane with coordinates (x, y) and parameter t takes values on the interval [t1, t2]. Each curve has an associated orientation o(c) with two possible values ±1 determining the parameter $t_F(c)$ of the first point $r(t_F(c))$ on the curve and the parameter $t_L(c)$ of the last point $r(t_L(c))$ on the curve:

$$t_F(c) = \frac{t_1+t_2}{2} + o(c)\frac{t_1-t_2}{2}$$

$$t_L(c) = \frac{t_1+t_2}{2} - o(c)\frac{t_1-t_2}{2}$$

Herein, it is assumed that the curve functions in Equation 1 are analytical and thus infinitely differentiable. The curve tangent vector is defined by $$T(r_i(t)) = \frac{o(c_i)}{\sqrt{x'_i(t)^2 + y'_i(t)^2}}(x'_i(t), y'_i(t)) \quad \text{Equation 2}$$

so that it changes the orientation when the orientation of the curve changes. The signed curvature is defined by $$\kappa(r_i(t)) = o(c_i)\frac{x'_i(t)y''_i(t) - y'_i(t)x''_i(t)}{\sqrt{(x'_i(t)^2 + y'_i(t)^2)^3}} \quad \text{Equation 3}$$

The curvature is positive (negative) if the tangent vector is rotating counterclockwise (clockwise) when the point on the curve is moving from the first to the last point of the curve.

As used herein, "boundary", or variations thereof, encloses a region R and is defined as a list of N oriented curves. Boundary may be represented as:

$$B(R)=\{c_i, i=1 \ldots N\}$$

$$c_i=\{r_i(t)=(x_i(t),y_i(t)), t \in [t_{i1}, t_{i2}]\} \quad \text{collectively, Equation 4}$$

The curves are connected together such that the last point of each curve coincides with the first point of the next curve and that the last point of the last curve coincides with the first point of the first curve. This may be represented by:

$$r_i(t_L(c_i))=r_{i+1}(t_F(c_{i+1})) \; i=1, \ldots, N-1$$

$$r_N(t_L(c_N))=r_1(t_F(c_1))$$

For the case N=1, the boundary includes of a single curve forming a loop. Curves are assumed not to intersect other curves and a curve is assumed to also not intersect itself, except at the first and the last point where each curve is connected to the next curve in the list, or to itself in case N=1. The region R enclosed by the boundary B(R) is thus referred to always being simply connected. The area (A(B (R)) of the region R enclosed by the boundary B(R) is defined by $$A(B(R)) = \frac{1}{2}\sum_{i=1}^{N} \int_{t_{i1}}^{t_{i2}} \left(x_i(t)\frac{dy_i(t)}{dt} - y_i(t)\frac{dx_i(t)}{dt}\right)dt$$

The region R enclosed by the boundary (B(R) is defined depending on the value of A(B(R)), as follows:

If the area A(B(R)) is positive, the boundary B(R) is oriented counter-clockwise and the region R is defined to lie on the left side of the tangent vector $T(r_i(t))$ on each curve.

Otherwise, if the area A(B(R)) is negative, the boundary B(R) is oriented clockwise and the region R is defined to lie on the right side of the tangent vector $T(r_i(t))$ on each curve.

The regions with negative areas are referred to as holes.

For the purposes of discussion herein, a region set $\mathcal{R}$ may be defined as a set of disjoint regions without any common points, and may be represented as $$\mathcal{R}=\{R_i\} \text{ wherein } i \ne j \Leftrightarrow R_i \cap R_j = \emptyset$$

For the purposes of discussion herein, a boundary set $\mathcal{B}(\mathcal{R})$ is defined as a set of boundaries of the regions from the region set $\mathcal{R}$, and may be represented as $$\mathcal{B}(\mathcal{R})=\{\mathcal{B}(\mathcal{R}_i), \mathcal{R}_i \in \mathcal{R}\} \quad \text{Equation 7}$$

As discussed above, the boundaries are formed by curves that are defined by parametric curve functions. Since the regions in $\mathcal{R}$ are disjoint, the boundaries inside the boundary set $\mathcal{B}(\mathcal{R})$ are also disjoint.

The Boolean operations on boundary sets are defined analogously to the Boolean operations on polygon sets, commonly referred to in IC physical verification tools as "layers". Accordingly, Boolean operations such as union, intersection, and difference of two region sets $\mathcal{R}_1=\{R_{1i}\}$ and $\mathcal{R}_2=\{R_{2j}\}$ may be defined as $$\mathcal{R}_1 \cup \mathcal{R}_2 = \{r : r \in R_{1i} \in \mathcal{R}_1 \vee r \in R_{2j} \in \mathcal{R}_2\} \quad \text{Equation 8}$$

$$\mathcal{R}_1 \cap \mathcal{R}_2 = \{r : r \in R_{1i} \in \mathcal{R}_1 \wedge r \in R_{2j} \in \mathcal{R}_2\} \quad \text{Equation 9}$$

$$\mathcal{R}_1 \setminus \mathcal{R}_2 = \{r : r \in R_{1i} \in \mathcal{R}_1 \wedge r \notin R_{2j} \in \mathcal{R}_2\} \quad \text{Equation 10}$$

The result of each of the above operations $O \in \{\cup, \cap, \setminus\}$ is again a region set including of disjoint regions $R_k$, given as $$\mathcal{R}_1 O \mathcal{R}_2 = \{R_k\} \quad \text{Equation 11}$$

The union, the intersection and the difference of the boundary sets $\mathcal{B}(\mathcal{R}_1)=\{B(R_{1i})\}$ and $\mathcal{B}(\mathcal{R}_2)=\{B(R_{2j})\}$ are defined as the sets of boundaries around the regions contained in the region sets in Equations (8), (9), (10):

$$\mathcal{B}(\mathcal{R}_1) \cup \mathcal{B}(\mathcal{R}_2) = \mathcal{B}(\mathcal{R}_1 \cup \mathcal{R}_2) \quad \text{Equation 12}$$

$$\mathcal{B}(\mathcal{R}_1) \cap \mathcal{B}(\mathcal{R}_2) = \mathcal{B}(\mathcal{R}_1 \cap \mathcal{R}_2) \quad \text{Equation 13}$$

$$\mathcal{B}(\mathcal{R}_1) \setminus \mathcal{B}(\mathcal{R}_2) = \mathcal{B}(\mathcal{R}_1 \setminus \mathcal{R}_2) \quad \text{Equation 14}$$

The result of each of these operations $O \in \{\cup, \cap, \setminus\}$ is again a boundary set including disjoint boundaries $B(R_k)$:

$$\mathcal{B}(\mathcal{R}_1) O \mathcal{B}(\mathcal{R}_2) = \{B(\mathcal{R}_k)\}$$

For the purposes of discussion herein, a curve section $c(\tau_1, \tau_2)$ of the curve c may be represented as $$c(\tau_1,\tau_2)=\{r(t)=(x(t),y(t)), t_1 \le \tau_1 \le t \le \tau_2 \le t_2\} \quad \text{Equation 16}$$

The first and the last point of the curve section are defined to be $r(\tau_1)$ and $r(\tau_2)$, respectively, if $o(c)=+1$, or vice versa if $o(c)=-1$. In general, each of the boundaries $b_k=B(R_k)$ resulting from the Boolean operation between boundary sets will consist of sections of the curves that were originally either in one of the boundaries $b_{1i}=B(R_{1i})$ from the first boundary set or one of the boundaries $b_{2j}=B(R_{2j})$ from the second boundary set. The start and the end points of the curve sections will coincide with the intersection points between the curves in $b_{1i}$ and $b_{2j}$: A set I of the intersecting points may be represented by $$I=\{r: r \in c \in b_{1i}=B(R_{1i}) \wedge r \in c' \in b_{2j}=B(R_{2j})\} \qquad \text{Equation 17}$$

For the purposes of discussion herein, it is assumed that the curves c and c' are not the same or overlapping and they only intersect at a finite number of intersecting points. An exception to this requirement is when the two curves are lines which are collinearly overlapping. In this case, the start point and the end point of the sections of both lines correspond to the start point and the end point of the overlapping segments of the lines.

For the purposes of discussion herein, a node may be defined as a set of all intersection points (I) within minimum node distance $\mu$. More precisely, each intersection point r may be assigned a node $n(r)$ such that $$|r_1-r_2| \leq \mu \Leftrightarrow n(r_1)=n(r_2) \qquad \text{Equation 18}$$

From Equation 18 it may be understood that even if the distance between two intersection points $r_1$ and $r_m$ is larger than $\mu$, the two intersection points $r_1$ and $r_m$ may still belong to the same node by transitivity if there are other intersection points $r_i$ such that $$|r_i-r_{i+1}|<\mu, \ i=1 \ldots m-1 \qquad \text{Equation 19}$$

For the purposes of discussion herein, a pair of curve sections $c_k(\tau_1, \tau_2)$ and $c_l(\tau_1', \tau_2')$ are considered to be connected at a node n if both the last point $$r_k(t_L(c_k(\tau_1, \tau_2)))$$

of the first section $c_k(\tau_1, \tau_2)$ and the first point $$r_l(t_F(c_l(\tau_1', \tau_2')))$$

of the second section $c_l(\tau_1',\tau_2')$ belong to node n, which is represented by $$n(r_k(t_L(c_k(\tau_1, \tau_2)))) = n(r_l(t_F(c_l(\tau_1', \tau_2')))) = n \qquad \text{Equation 20}$$

A curve section can be considered to be connected to itself if it forms a loop such that the first point of the curve section and the last point of the curve section belong to the same node.

For the purposes of discussion herein, curve sections $c_l(\tau_1',\tau_2')$ and $c_k(\tau_1, \tau_2)$ are considered to be tangential to each other at node n if the first points of both curve sections belong to node n. This is represented by $$n(r_k(t_F(c_k(\tau_1, \tau_2)))) = n(r_f(t_F(c_k(\tau_1', \tau_2')))) = n \qquad \text{Equation 21}$$

Alternatively, the curve sections $c_l(\tau_1', \tau_2')$ and $c_k(\tau_1, \tau_2)$ are considered to be tangential to each other at node n if the last points of both curve sections belong to node n. This is represented by $$n(r_k(t_L(c_k(\tau_1, \tau_2)))) = n(r_f(t_L(c_k(\tau_1', \tau_2')))) = n \qquad \text{Equation 22}$$

In addition to the above conditions, the curve sections $c_l(\tau_1',\tau_2')$ and $c_k(\tau_1,\tau_2))$ are considered to be tangential to each other at node n if tangents of both curve sections $c_k(\tau_1, \tau_2)$ and $c_l(\tau 10, \tau 20)$ at the end points belonging to node n have the same direction. This is represented by $$L(T(r_k(t_L(c_k(\tau_1, \tau_2)))), T(r_l(t_F(c_l(\tau_1', \tau_2'))))) = 0 \qquad \text{Equation 23}$$

For the purposes of discussion herein, curve section $c_l(\tau_1',\tau_2')$ is defined as a successor of curve section $c_k(\tau_1,\tau_2))$ by $$c_l(\tau_1',\tau_2')=\sigma(c_k(\tau_1,\tau 2)) \qquad \text{Equation 24}$$

The aforementioned successor relationship is defined with respect to a sign parameter S, which may be defined as $$S = \begin{cases} +1, \text{ when } O = \bigcup \\ -1, \text{ when } O = \in \{\bigcap, \setminus\} \end{cases}$$

Certain criteria need to be satisfied when defining the curve section $c_l(\tau 10, \tau 20)$ as a successor of curve section $c_k(\tau_1,\tau_2)$. These include:
1. $c_l(\tau_1',\tau_2')$ and $c_k(\tau_1,\tau_2)$ are connected at node n.
2. If there are other curve sections tangential to $c_k(\tau_1,\tau_2)$, then among them the signed curvature $$S_K(r_k(t_L(c_k(\tau_1, \tau_2))))$$

takes the minimum value.
3. If there are other curve sections tangential to $c_k(\tau_1',\tau_2')$ at node n, then among them the signed curvature $$S_K(r_l(t_F(c_l(\tau_1', \tau_2'))))$$

takes the minimum value.
4. The signed angle between the curve tangents at node n takes the minimum value among all pairs of connected curve sections at node n. The signed angle is represented by $$S_L(T(r_k(t_L(c_k(\tau_1, \tau_2)))), T(r_l(t_F(c_l(\tau_1', \tau_2'))))) \qquad \text{Equation 25}$$

It should be noted that, in certain instances, a curve may be its own successor.

The process of determining a successor of a curve section is discussed with reference to FIG. 1 that illustrates an example system 100 of curve sections 1-8 each including a node N as one of the endpoints. In FIG. 1, the arrows indicate the curve directions from a first point to a last point on each curve section. As is understood, the curve direction is determined by a curve equation that defines the curves including the corresponding curve sections. For instance, the direction of curve section 5 is determined from the curve equation of the curve that includes the curve section 5. As illustrated, the curve sections 2 and 3 are tangential to each other at node N, curve sections 4 and 5 are tangential to each other at node N, curve sections 6 and 7 are tangential to each other at node N, and curve sections and 8 and 1 are tangential to each other at node N.

The signed curvature of each curve entering node N is calculated as $$S\kappa(r_k(t_L(c_k(\tau_1, \tau_2))))$$

and the signed curvature of each curve section exiting node N is calculated as $$S\kappa(r_l(t_F(c_l(\tau_1', \tau_2')))),$$

where curvature function κ (kappa) is defined by Equation 3. For S=1, the curvature at the node N is minimum for curve sections 3, 5, 6 and 8. Of these, the curve section pairs (3,6), (3,8), (5,6), (5,8) are connected. The curve sections in a pair are considered as being connected since the curve direction of curves in a curve section pair does not change at the node N. Thus, referring to FIG. 1, the curve section pairs (3,6) and (3,8) are connected since the direction of curve 3 at node N is into the node N and the direction of curve sections 6 and 8 is away from node N. Likewise, the curve section pairs (5,6) and (5,8) are connected since the direction of curve 5 at node N is into the node N and the direction of curve sections 6 and 8 is away from node N. Among these curve section pairs, the pair (5,6) has the minimum angle between the curve tangents at node N. Curve section 6 is thus considered as the successor of curve section 5, and this is represented as, 6=σ(5).

For S=−1, the curvature at the node N is maximum for curve sections 2, 4, 7 and 1. Of these, the curve section pairs (2,7), (2,1), (4,7), (4,1) are connected (as discussed above). Among these curve section pairs, the pair (2,1) has the minimum angle between the curve tangents at node N. Curve section 1 is thus considered as the successor of curve section 2, and this is represented as, 1=σ(2).

For the purposes of discussion herein, a result boundary b is defined as a list of curve sections from the boundaries contained in boundary sets B(R$_1$) and B(R$_2$) that form a boundary as defined above. The result boundary is represented as a list of curve sections $$b=\{c_1(\tau_1,\tau_1'), \ldots, c_i(\tau_i,\tau_i'), \ldots, c_N(\tau_N,\tau_N')\} \quad \text{Equation 26.1}$$

$$r_i(t_L(c_i))=r_{i+1}(t_F(c_{i+1})) \; i=1 \ldots N-1 \quad \text{Equation 26.2}$$

$$r_N(t_L(c_N))=r_1(t_F(c_1)) \quad \text{Equation 26.3}$$

Equations 26.2 and 26.3 express the condition for the curves to form a boundary as defined above, indicating that the last point of each curve section in the list coincides with the first point of the next curve section in the list, and the last point of the last curve section in the list coincides with the first point of the first curve section in the list.

Additional condition that need to be satisfied is that in the list order each curve section is followed by its successor. This may be represented as $$c_{i+1}(\tau_{i+1},\tau_{i+1}')=\sigma(c_i(\tau_i,\tau_i')) \; i=1 \ldots N-1$$

$$c_1(\tau_1,\tau_1')=\sigma(c_N(\tau_N,\tau_N')) \quad \text{Equation 27}$$

Equation 27 indicates that each curve section in the list is the successor of the previous curve section in the list, and the first section in the list is the successor of the last curve section in the list.

Each result boundary b encloses a simply connected planar region which are denoted by R, i.e. b=B(R). In general, the set of all result boundaries b=B(R) resulting from the Boolean operation $\mathcal{B}(\mathcal{R}_1)O\mathcal{B}(\mathcal{R}_2)$ between boundary sets is also a boundary set, which may be referred to as a result boundary set and denoted by $\mathcal{B}$, and represented as $$\mathcal{B}=\{B(R)\} \quad \text{Equation 28}$$

The area of the result boundary can be negative, in which case the result boundary may represent a hole (or gap).

Figure 2:
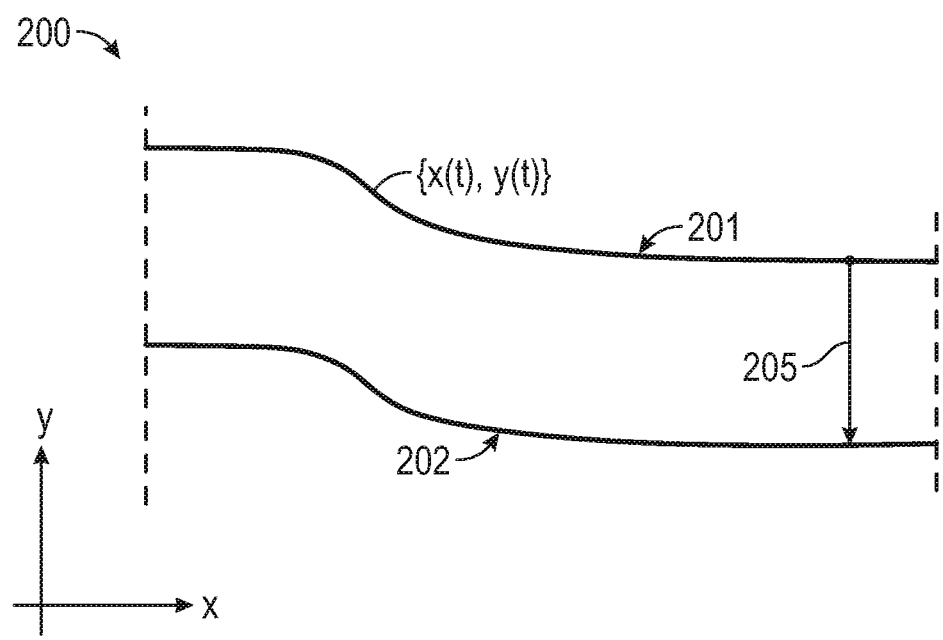
FIG. 2 illustrates a schematic of a circuit feature for an IC design, according to some embodiments.

FIG. 2 illustrates a schematic of a circuit feature 200 for an IC design, according to some embodiments. Feature 200 is delimitated by a first parametric curve 201-1 and a second parametric curve 201-2 in a plane (e.g., the XY plane). Geometrical objects in Computer Aided Design systems are usually represented using certain classes of curves. Typically these would include lines, conic sections (circular and elliptic arcs) and polynomial splines in mechanical design, lines and circular arcs in printed circuit board design, and only lines in integrated circuit design. The restriction to certain classes of curves applies not only to design tools, but also to data formats used for exchanging manufacturing information. Although this is not a limitation in the original design domain, for some applications geometrical representation by more general classes of curves is needed. For example, as discussed above, integrated circuit layout design tools are now not only used for designing electrical devices and interconnect, but also structures in other types of technologies that can be implemented on silicon, such as silicon photonics, MEMS and microfluidics. The geometries of such devices typically need to adhere to certain smoothness requirements or even be a mathematical solution of some underlying physical model, therefore they may not be satisfactorily described by any of the predetermined classes of curves. Instead, their natural description may be in terms of completely general parametric curves defined by $$r(t)=\{x(t),y(t)\} \; t_1 \le t \le t_2$$

where r is a point on the curve in the XY plane with coordinates (x, y) and t is the parameter selected from an interval starting at an initial parameter value, $t_1$, and ending at a final parameter value, $t_2$. The advantage of such description is that it may be much closer to the mathematical model of the device, therefore calculations on it may be more accurate and easier to perform. For example, if the functions describing the curves are known, then the intersections between curves or various curve differentials (tangent, normal, curvature) can be calculated with improved accuracy. From the intersections, the boundaries enclosing a region may be obtained. Boolean operations may then be performed on the boundaries.

The method for performing Boolean operations on planar region boundaries defined by parametric curves is now described. The method begins with providing a first list $N_1$ of parametric curves $c_1, c_2, \ldots, c_{N_1}$ (e.g., curves defined by parametric equations) that define a boundary set $\mathcal{B}_1$ and a second list $N_2$ of parametric curves $c_{N_1}, \ldots c_{N_1+N_2}$ that define a boundary set $\mathcal{B}_2$. A list of Boolean operations (e.g., intersection, union, difference) to be performed between the boundary sets $\mathcal{B}_1$ and set $\mathcal{B}_2$ are also provided. In addition, the minimum distance p under which two curve intersections are considered to belong to the same node is also provided.

In an alternative embodiment, when the boundary set $\mathcal{B}_2$ is an empty set and the Boolean operation is a union operation, the method will determine the boundary set $\mathcal{B}_1$ formed by the curves $c_1, c_2, \ldots, c_{N_1}$, if these curves intersect to form valid boundaries at discussed above. In an embodiment, when the operation is a difference (\) operation, the method includes reversing the orientation of each of the curves $c_{N_1}, \ldots c_{N_1+N_2}$, this operation may be represented as $o(c_i) \leftarrow -o(c_i)$. A single list N including all the curves that define the boundary set $\mathcal{B}_1$ and boundary set $\mathcal{B}_2$ is created.

The method then includes finding all intersections $r_i(\tau)=r_j(\tau')$ between all pairs of curves $c_i$, $c_j$, where $i, j=1, \ldots, N$ and $i<j$ and denoting each intersection point by $l(i,\tau,j,\tau')$. Each intersection point $l(i,\tau,j,\tau')$ is then assigned a node $n(i,\tau,j,\tau')$ such that two intersection points within the distance μ are assigned to the same node. This may be represented as $$|r_i(\tau)-r_k(\tilde{\tau})|<\mu \Leftrightarrow n(i,\tau,j,\tau')=n(k,\tilde{\tau},l,\tilde{\tau}') \quad \text{Equation 29}$$

For each curve $c_k$, the method then finds all the curve sections between the intersection points determined above. In order to find the curve sections, first, a list of all intersection points $I(i,\tau,j,\tau')$, with $i=k$, is created. Then, list is then sorted by the values of parameter T in increasing order. Further, for each adjacent pair of intersections $(k,\tau_1, j_1,\tau_1')$ and $(k,\tau_2,j_2,\tau_2')$ in the sorted list, curve section $(c_k(\tau_1, \tau_2), n_1, n_2)$ is created, where $c_k(\tau_1,\tau_2)$ is the section of the curve $c_k$ between parameter values $\tau_1$ and $\tau_2$ and $n_1=n(k,t_F(c_k(\tau_1,\tau_2)),j_1,\tau_1')$ and $n_2=n(k,t_L(c_k(\tau_1,\tau_2)),j_2,\tau_2')$ are the nodes of the intersections at the first and the last point of the section $c_k(\tau_1,\tau_2)$, respectively.

The method then includes finding the successors of each the different curve section. Firstly, the sign parameter S is defined. As mentioned above, the sign parameter S is considered to have a value $S=+1$, when an operation O is a union (∪) operation and a value $S=-1$, when an operation O is either an intersection (∩) operation or a difference (\) operation. The method then includes determining all pairs of connected sections $s=(c_k(\tau_1,\tau_2),n_1,n_2)$ and $s'=(c_l(\tau_1',\tau_2'),n_1, n_2)$ such that $n_2=n_1'$. For each pair of connected sections $(s,s')$, the method then includes finding the angle between the curve tangents at the connecting node $n=n_2=n_1'$. This is represented as $$\alpha(s, s', n) = L(T(r_k(t_L(c_k(\tau_1, \tau_2)))), T(r_l(t_F(c_l(\tau_1', \tau_2'))))) \quad \text{Equation 30}$$

For each pair of connected sections (s,s'), the method then determines signed curvatures of the curves at the connecting node $n=n_2=n_1'$. The signed curvatures are represented by $$\kappa(s, n) = S\kappa(r_k(t_L(c_k(\tau_1, \tau_2)))) \quad \text{Equation 31}$$

$$\kappa(s', n) = S\kappa(r_l(t_F(c_l(\tau_1', \tau_2')))) \quad \text{Equation 32}$$

The pairs of connected curve sections (s, s') for which $|\alpha(s,s',n)|=\pi$ are disregarded. For each node n, the method then determines the pair of connected curve sections $(s_m, s_m')$ for which $S\alpha(s_m, s_m', n)$ is minimum. From all such pairs for a given node n, the method then includes finding the node pair for which $\kappa(s_m, n)$ and $\kappa(s_m', n)$ are minimum. From the node pairs, curve section $s_m'$ leaving the node n is defined as the successor of the curve section $s_m$ entering the node n, and this is represented as $s_m'=\sigma s_m$. For the purposes of discussion herein, "entering" and "leaving" a node is based on the orientation of the curve section (which by definition is the same as the orientation of the curve of which the curve sections are a part). As is understood, the orientation of the curve sections (and the curve) is determined by the equation of the curve. The orientation determines which of the two endpoints of the curve section is the first point and which is the last point. If the last point of the curve section is coinciding with the node, then the curve section is considered as entering the node. Similarly, if the first point of the curve section is coinciding with the node, then the curve section is considered as leaving the node.

The method then determines the boundaries formed by the curve sections. This may include creating a list of curve sections s for which the respective successors σ(s) have been defined and associating with each curve section a Boolean variable. For each curve section s, the curve section s is disregarded if it has already been visited. Otherwise, a new boundary b is created and assigned s'←s. s' is added to the boundary b and s' is marked as visited. The assignment s'←σ(s') is then determined. If s'≠s, then the method proceeds with adding s' to the boundary b and s' is marked as visited. Else, if s'=s, boundary b is added to the result boundary set $\mathcal{B}=\mathcal{B}_1 O \mathcal{B}_2$ and the method proceeds with ignoring curve section s if it has already been visited (as performed above). Finally, the method includes calculating an area A(b) of each boundary b and marking the boundaries having areas less than 0 (A(b)<0) as holes or gaps in the circuit layout.

The various steps in the above-discussed method for performing Boolean operations on planar region boundaries defined by parametric curves are now discussed in relative detail. It should be noted that the method steps consistent with the present disclosure may be performed in a sequence different from the sequences discussed. Furthermore, methods consistent with the present disclosure may include at least two or more steps performed overlapping in time, or almost simultaneously.

The method assumes that the desired Boolean operation to be performed on the boundaries is provided as an input, along with the number $N_1$ of curves defining the first boundary set $\mathcal{B}_1$ and the number $N_2$ of curves defining the second boundary set $\mathcal{B}_2$. In the instance that $N_2=0$ and the operation is a union operation (∪), the method creates the boundary set $\mathcal{B}_1$ from the $N_1$ curves. Also provided as inputs are (1) arrays of $N=N_1+N_2$ symbolic expressions $s_x[1 \ldots N]$ and $s_y[1 \ldots N]$ that represent curve functions, (2) arrays of $N=N_1+N_2$ parameter interval bounds $t_1[1 \ldots N]$ and $t_2[1 \ldots N]$, each defined as $t_1[i]:=t_{i1}$ and $t_2[i]:=t_{i2}$, and (3) array of $N=N_1+N_2$ curve orientations o[i] having possible values ±1. In addition, the inputs may include a predefined function INTERSECTIONS $(x,y,t_1,t_2,N,\epsilon,\eta,\lambda, n_D,\beta)$ that returns the list of all intersections between the curves. The arguments of the function INTERSECTIONS include arrays of symbolic expressions x, y representing curve functions, arrays of parameter interval bounds $t_1, t_2$, the total number of curves $N=N_1+N_2$, initial discretization tolerance ε (typically set by the manufacturing tolerances or design rules), reduction factor for the discretization tolerance η (typical value is around 0.1), precision λ by which the intersection points are determined (typical value of λ is around $10^{-6}$), Taylor series expansion order $n_D$ for curve discretization (typical value is around 3), and correlation factor β for curve discretization (typical value is around 1).

The result is a list of intersections with components intersection.c1, intersection.c2 representing the array indices of the two intersecting curves, object.t1 and object.t2 representing the corresponding parameter values on the two curves at the intersection, and object.point representing the intersection point.

The input to the method also includes predetermined functions to obtain the numerical value of the symbolic expression e for parameter value t, function EVALUATE(e, t) and to get the symbolic expression representing the derivative of the symbolic expression e, function DERIVE (e). The minimum distance μ between the intersection points in the same node is also provided as an input.

In some embodiments, the method may include executing the functions FIRST(section) and LAST(section) to obtain the parameter values for the first and last point of the an example curve section $c_\tau(\tau_1,\tau_2)$ depending on the orientation of the curve section. The argument section is assumed to be an object with components section.t1, section.t2 and section.o containing the parameter values $\tau_1,\tau_2$ and the curve orientation (c). In an example, the functions FIRST(section) and LAST(section) may be implemented as

```
function first(section)
    if section.o>0 then
        return section.t1
    else
        return section.t2
    end if
end function
function last(section)
    if section.o>0 then
        return section.t2
    else
        return section.t1
    end if
end function
```

In some embodiments, the method may include calculating the tangent vector of the curve section at parameter value t with the orientation depending on the curve orientation. The function that is executed may include the argument section assumed to be an object with components section.x, section.y containing the symbolic expressions to calculate the points and the derivatives of the curve and section.o containing the orientation of the curve section. In an example, the function TANGENT may be implemented as:

```
function tangent(section, t)
    t.x←section.o×EVALUATE(section.x[1],t)
    t.y←section.o×EVALUATE(section.y[1],t)
    n←√tangent.x²+tangent.y²
    t.x←t.x/n
    t.x←t.y/n
    return t
end function
```

In some embodiments, the method includes calculates the signed curvature of the curve section at parameter value t depending on the curve orientation. The argument section in the function for performing this step is assumed to be an object with components section.x, section.y containing the symbolic expression to calculate the points and the derivatives of the curve and section.o containing the orientation of the curve section. In an example, the function CURVATURE may be implemented as:

```
function CURVATURE(section,t)
    x'←section.o×EVALUATE(section.x[1],t)
    y'←section.o×EVALUATE(section.y[1],t)
    x"←section.o×EVALUATE(section.x[2],t)
    y"←section.o×EVALUATE(section.y[2],t)
```

$$\text{return} \leftarrow section.o \times \left(\frac{x'y'' - y'x''}{((x')^2 + (y')^2)^2}\right)^{\frac{3}{2}}$$

end function

In some embodiments, the angle α (0≤α≤2π) and the principal value of the angle α (-π<Pα≤π) between two vectors v1 and v2 may be obtained using example functions PRINCIPAL-ANGLE and ANGLE. The two vectors v1 and v2 are provided as objects with components v1.x, v1.y, v2.x, v2.y containing the coordinates of the two vectors v1 and v2. In an example, the functions may be implemented as:

```
function PRINCIPAL-ANGLE(v1,v2)
    n₁←v1.x×v1.x+v1.y×v1.y
    n₂←v2.x×v2.x+v2.y×v2.y
    c←(v1.x×v2.x+v1.y×v2.y)/(n₁n₂)
    s←(v1.x×v2.y-v1.y×v2.x)/(n₁n₂)
    return SIGN(s)×arcos(c)
end function
function ANGLE(v1,v2)
    p←PRINCIPAL-ANGLE(v1,v2)
    if p<0 then
        return p+2π
    else
        return p
    end if
end function
```

In some embodiments, the method may use a function AREA to compute the area of the boundary given by the arrays of symbolic expressions x,y representing curve functions, arrays of parameter $t_1,t_2$, array of curve orientations o and the number of curves K. In an example, the function may be implemented as:

```
function AREA(x,y,t₁,t₂,o,K,ε,M)
    j←1
    for k←1, K do
        τ[k]←DISCRETIZATION(x[k],y[k],t₁[k],t₂[k],M,ε,β)
        n←LENGTH(τ[k])
        for i'←1,n do
            if o[k]>0 then
                i←i'
            else
                i←n+1-i'
            end if
            x[j]←EVALUATE(x[k],τ[k][i])
            y[j]←EVALUATE(y[k],τ[k][i])
            j←j+1
        end for
        j←j-1
    end for
    a←0
    for i←1, j-1 do
        a←a+(x[i]y[i+1]-y[i],x[i+1])/2
    end for
    return a
end function
```

In some embodiments, the method may execute a function NODES to obtain an associative table of node assignments for all intersections with are given as a list intersections of objects i with the component i. point containing the intersection point. The nodes are assigned to the intersection points by finding the transitive closure of the relation. In an example, the function may be implemented as:

```
function NODES(intersection,µ)
    j←1
    for i∈intersections do
        intersection[j]←i
        equivalent[j]←j
        node[i]←0
        j←j+1
    end for
    N←j←1
    for j←1, N do
        for k←j+1,N do
            dx←intersection[j].point.x−intersection[k].point.x
            dy←intersection[j].point.y−intersection[k].point.y
            if √(dx²+dy²)<µ then
                l←equivalent[j]
                equivalent[j]←k
                equivalent[k]←l
            end if
        end for
    end for
    n←1
    for j←1, N do
        if node[intersection[j]]=0 then
            node[intersection[j]]←n
            k←equivalent[j]
            while k≠j do
                node[intersection[k]]←n
            end while
            n←n+1
        end if
    end for
    return node
end function
```

In some embodiments, the method may include finding all intersections of the curves and obtain a list of all sections of curves between the intersections together with the information about the nodes at endpoints of each curve section. The method may use as inputs arrays x,y of functions to calculate the points and the derivatives of the curves, the arrays $t_1, t_2$ of lower and upper parameter values, the array o of the curve orientations, the number of curves N, the minimum distance µ between the intersections belonging to the same node, and the parameters $\epsilon, \eta, \lambda, n_D, \beta$. The output is a list of objects of type section with components section.x and section.y containing the arrays of symbolic expressions to calculate the points and the derivatives of the section, section.t1 and section.t2 containing the lower and the higher parameter values $\tau_1$ and $\tau_2$ of the curve section, section.o containing the orientation of the section, section.node1 and section.node2 containing the nodes at the first and the last point of the section, and section.i containing the index of the curve from which the curve section has been derived. In an example, the function may be implemented as:

```
function SECTIONS (x, y, t₁, t₂, o, N, ϵ, η, λ, n_D, β, µ)
    intersections ← CURVE-INTERSECTIONS
    (x, y, t₁, t₂, o, N, ϵ, η, λ, n_D, β, µ)
    for i ∈ intersections do
        i.point.x ← (EVALUATE(x[i.c1](i.t1) +
            EVALUATE(x[i.c2](i.t2))) / 2
        i.point.y ← (EVALUATE(y[i.c1](i.t1) +
            EVALUATE(y[i.c2](i.t2))) / 2
    end for
    node ← NODES(intersections,µ)
    sections ← EMPTY-LIST
```

-continued

```
    for k ← 1, N do
        for intersection ∈ intersections do
            I ← EMPTY-LIST
            if i.c1 = k then
                APPEND (I, intersection)
            end if
        end for
        n ← length(I)
        if n > 1 then
            I ← SORT(I, i1.t1 < i2.t1)
            i ← 1
            while i < n do
                j ← i + 1
                while j ≤ n ∧ node[I[i]] = node[I[j]]do
                    j ← j + 1
                end while
                if j < n then
                    section.x[0] ← x[k]
                    section.y[0] ← y[k]
                    for m ← 1, 2 do
                        section.x[m] ← DERIVE(section.x[m − 1])
                        section.y[m] ← DERIVE(section.y[m − 1])
                    end for
                    section.o ← o[k]
                    section.i ← k
                    section.t1 ← I[i].t1
                    section.t2 ← I[j].t1
                    if o(k) > 0 then
                        section.node1 ← node[I[i]]
                        section.node2 ← node[I[j]]
                    else
                        section.node1 ← node[I[j]]
                        section.node2 ← node[I[i]]
                    end if
                    APPEND(sections, section)
                end if
                i ← j
            end while
        end if
    end for
    return sections
end function.
```

In some embodiments, the successors of a given curve section may be implemented using a function having arguments as the sign S and the list sections containing the objects of type section with components section.o containing the orientation of the section, section.node1 and section.node2 containing the nodes at the first and the last point of the section, section.x and section.y containing the functions to calculate the points and the derivatives of the curve section, and section.t1 and section.t2 containing the lower and higher parameter values τ1 and τ2 of the curve section. The result obtained is an associated table successor associating to each section its successor section successor[section]. In an example, the function may be implemented as:

```
function SUCCESSORS(sections, S)
    for s ∈ sections do
        angle[s.node1] ← 2πS
        angle[s.node2] ← 2πS
    end for
    nodes ← EMPTY-LIST
    for s1 ∈ sections do
        for s2 ∈ sections do
            if s1.node2 = s2.node1 then
                node ← s1.node2
                if node ∉ nodes then
                    APPEND(nodes, node)
                end if
                T₁ ← × TANGENT(s1, LAST(s1))
                T₂ ← × TANGENT(s1, FIRST(s1))
```

-continued

```
            C₁ ← S × CURVATURE(s1, LAST(s1))
            C₂ ← S × CURVATURE(s1, FIRST(s1))
            α ← S × ANGLE(T₁, T₂)
            if |α| ≠ π then
               if angle[node] = 2π \/ α < angle[node] then
                  angle[node] ← α
                  section1[node] ← s1
                  section2[node] ← s2
                  tangent1[node] ← T₁
                  tangent2[node] ← T₂
                  curvature1[node] ← C₁
                  curvature2[node] ← C₂
               else
                  if α = angle[node]then
                     α₁ ← ANGLE(T₁, tangent1[node])
                     α₂ ← ANGLE(T₁, tangent1[node])
                     if α₁ = 0 /\ C₁ < curvature1[node]then
                        section1[node] ← s1
                        curvature1[node] ← C₁
                     end if
                     if α2 = 0 /\ C₂ < curvature2[node] then
                        section2[node] ← s2
                        curvature2[node] ← C₂
                     end if
                  end if
               end if
            end if
         end if
      end for
   end for
   for node ∈ nodes do
      successor[section1[node]] ← section2[node]
   end for
   return successor
end function.
```

In some embodiments, the boundaries may be obtained using a function that uses the list of sections and the associative table successor associating to each section its successor section successor[section]. The result is a list of objects of type boundary, each of which is a list of objects of type section. In an example, the function may be implemented as:

```
function BOUNDARIES(section,successor)
   boundaries←EMPTY-LIST
   for section ϵ sections do
      visited[section]←FALSE
   end for
   for section ϵ sections do
      if ¬visited(section) then
         boundary EMPTY-LIST
         s←section
      end if
      repeat
         visited [s]←TRUE
         APPEND(boundary,s)
         s←successor[s]
      until s=section
      if s≠section then
         APPEND(boundaries,boundary)
      end if
   end for
   return boundaries
end function
```

In some embodiments, a function may be defined to perform Boolean operations between first boundary set $\mathcal{B}_1$ and second boundary set $\mathcal{B}_2$. The first boundary set $\mathcal{B}_1$ is given by the number N1 of curves in boundary set $\mathcal{B}_1$, the arrays of symbolic expressions representing curve functions x[1, ..., N1] and y[1, ..., N1], the arrays t1[1, ..., N1] and t2[1, ..., N1] of the curve parameters and the array o[1, ..., N1] of curve orientations. The second boundary set $\mathcal{B}_2$ is given by the number of curves N2 in second boundary set $\mathcal{B}_2$, the arrays of symbolic expressions representing curve functions x[N1+1, ..., N1+N2] and y[N1+1, ... N1+N2], the arrays t1[N1+1, ..., N1+N2] and t2[N1+1, ..., N1+N2] of curve parameters and the array o[N1+1, ..., N1+N2] of curve orientations. In addition to the above parameters, the function also considers arguments $\epsilon$, $\eta$, $\lambda$, $n_D$, $\beta$, and $\mu$ required by the function to find the intersection between the curves and the function to find the nodes. The result is a list of objects of type boundary with components boundary. N containing the number of curves in the boundary, boundary.x, boundary.y containing the arrays of symbolic expressions representing curve functions, boundary.t1, boundary.t2 containing the arrays of parameter interval bounds, boundary. o containing the array of curve orientations, and boundary. area containing the area of the boundary. In an example, the function OPERATION may be implemented as:

```
function OPERATION(x, y, t₁, t₂, o, N₁, N₂, O, ϵ, η, λ, n_D, β, μ)
   j←1
   for i←N₁+1, N₁+N₂ do
      o[i]←−o[i]
   end for
   N←N₁+N₂
   if O=∪ then
      S←1
   else
      S←−1
   end if
   sections←SECTIONS(x, y, t₁, t₂, o, N, ϵ, η, λ, n_D, β, μ)
   successor←SUCCESSORS(sections, S)
   boundaries←BOUNDARIES(sections, successor)
   B←EMPTY-LIST
   for boundary∉boundaries do
      i←1
      for section∉ boundary do
         b.x[i]=section,x([0]
         b.y[i]=section.y[0]
         b.t1[i]=section.t1
         b.t2[i]=section.t2
         b.o[i]=section.o
         i←i+1
      end for
      b.N←i−1
      b.a←AREA(b.x, b.t1, b.t2, b.o, b.N, ϵ, M)
      APPEND(B, b)
   end for
   return B
end function
```

Boolean operations performed using the method according to the example embodiments disclosed herein will now be described. As discussed above, the Boolean operations are performed directly on the parametric curve equations. For the sake of explanation, the boundary set $\mathcal{B}_2$ is considered to be a null set, boundary set $\mathcal{B}_2=0$.

Figure 3A:
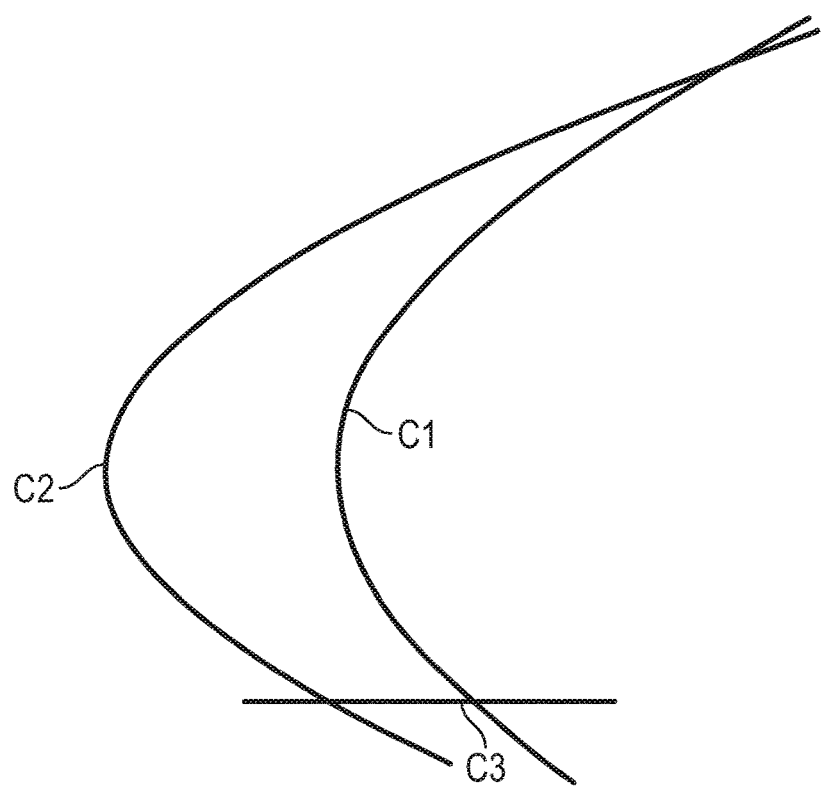
FIG. 3A illustrates example curves, according to embodiments disclosed.
Figure 3B:
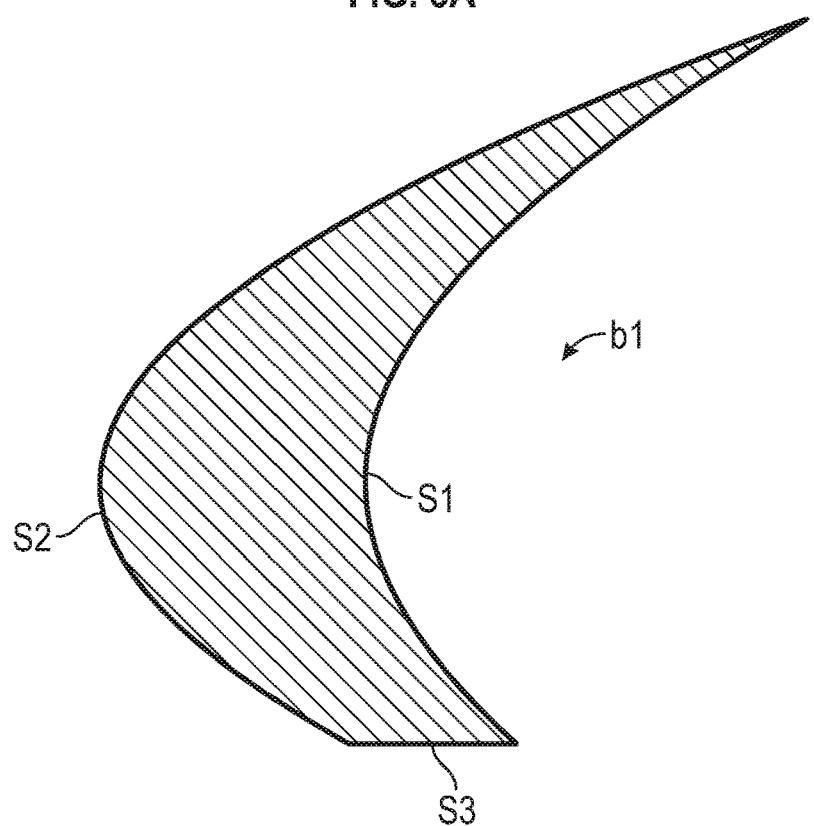
FIG. 3B illustrates a boundary created using curve sections of the curves in FIG. 3A, according to example embodiments.

FIG. 3A illustrates curves $c_1$, $c_2$, and $c_3$, according to example embodiments. FIG. 3B illustrates a boundary b1 created using curve sections s1, s2, and s3 of the curves $c_1$, $c_2$, and $c_3$, respectively, according to example embodiments. The curves $c_1$, $c_2$, and $c_3$ may be defined as:

$$c_1 = \begin{cases} x_1(t) = -235 + 200\cosh(t) \\ y_1(t) = 50\sinh(t) \end{cases}, t \in [-0.6, 0.85]$$

-continued $$c_2 = \begin{cases} x_2(t) = -210 + 200\cosh(t) \\ y_2(t) = 65\sinh(t) \end{cases}, t \in [-0.5, 0.7]$$

$$c_3 = \begin{cases} x_3(t) = t \\ y_3(t) = -25 \end{cases}, t \in [-20, 20]$$

As illustrated in FIG. 3A, the curves $c_1$, $c_2$, and $c_3$, intersect in three intersection points, defining three different curve sections s1, s2, and s3, respectively, between the intersection points. The three curve sections s1, s2, and s3 define the boundary b1 illustrated in FIG. 3B. As illustrated, the boundary b1 is defined by the intersections of two hyperbolas and one horizontal line. The boundary b1 has a positive area A(b1)=1245:91 and is thus oriented counter-clockwise.

Figure 4A:
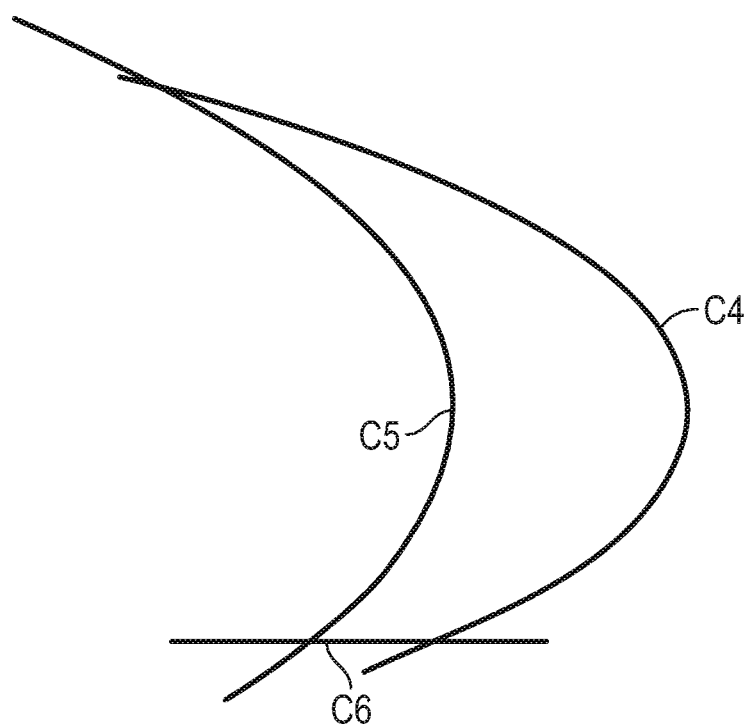
FIG. 4A illustrates example curves, according to example embodiments.
Figure 4B:
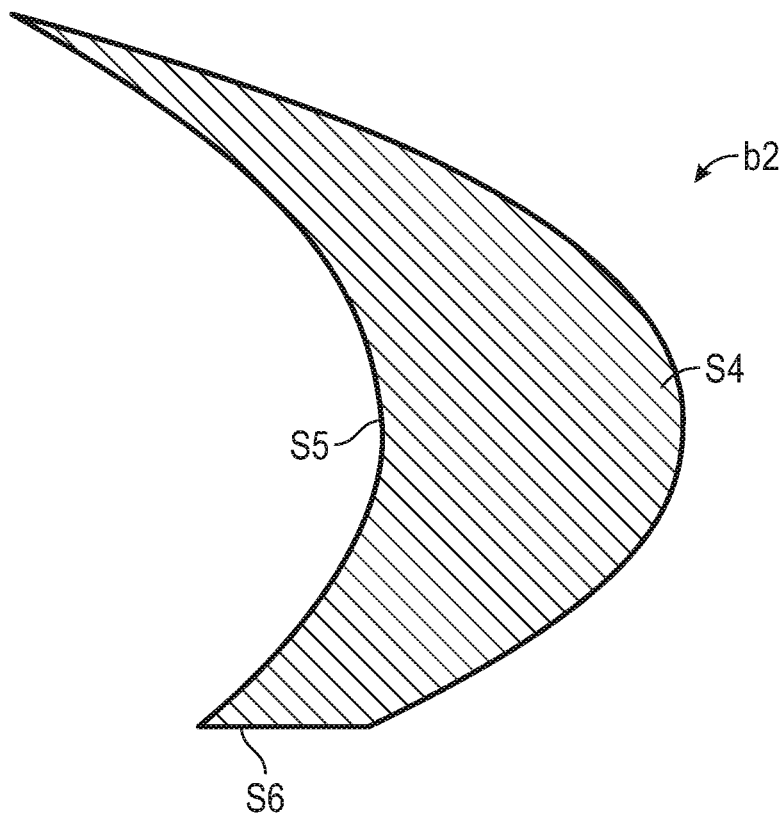
FIG. 4B illustrates a boundary created using curve sections of the curves in FIG. 4A, according to example embodiments.

FIG. 4A illustrates curves $c_4$, $c_5$, and $c_6$, according to example embodiments. FIG. 4B illustrates a boundary b2 created using curve sections s4, s5, and s6 of the curves $c_4$, $c_5$, and $c_6$, respectively, according to example embodiments. The curves $c_4$, $c_5$, and $c_6$, may be defined as:

$$c_4 = \begin{cases} x_4(t) = -165 + 200\cosh(t) \\ y_4(t) = 50\sinh(t) \end{cases}, t \in [-0.6, 0.8]$$

$$c_5 = \begin{cases} x_5(t) = -190 + 200\cosh(t) \\ y_5(t) = 65\sinh(t) \end{cases}, t \in [-0.5, 0.7]$$

$$c_6 = \begin{cases} x_6(t) = t \\ y_6(t) = -25 \end{cases}, t \in [-20, 20]$$

As illustrated in FIG. 4A, the curves $c_4$, $c_5$, and $c_6$, intersect in three intersection points, defining three different curve sections s4, s5, and s6, respectively, between the intersection points. The three curve sections s4, s5, and s6 define the boundary b2 illustrated in FIG. 4B. As illustrated, the boundary b2 is defined by the intersections of two ellipses and one horizontal line. The boundary b2 has a positive area A(b2)=1140.58 and is thus oriented counter-clockwise.

Figure 5:
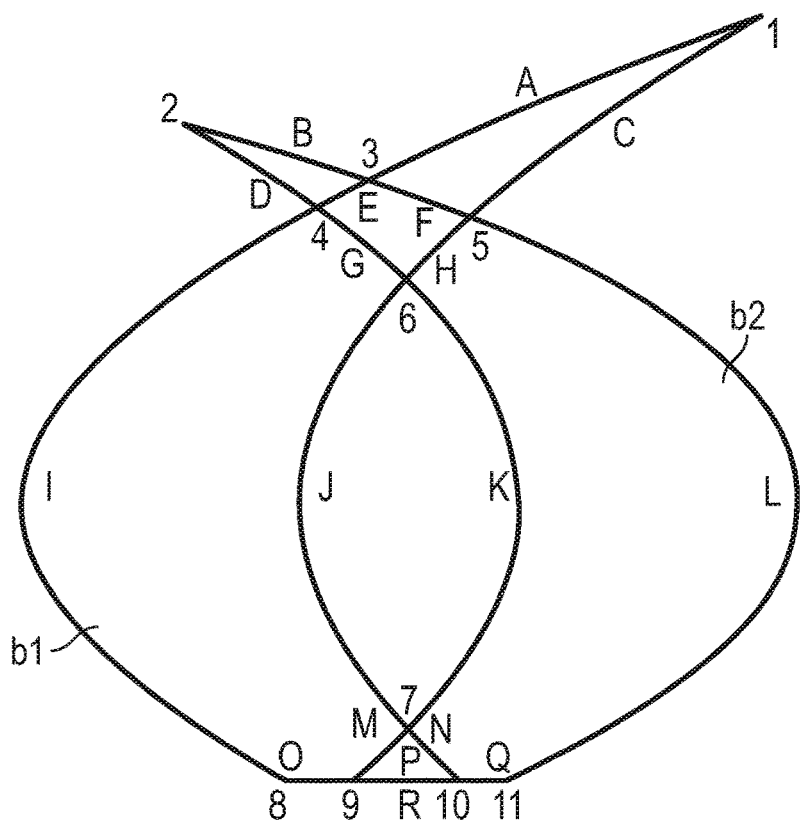
FIG. 5 illustrates the intersection between the curves of the boundaries in FIGS. 3B and 4B.

FIG. 5 illustrates the intersection between the two boundaries b1 and b2 obtained by plotting the curves $c_1$-$c_6$. For the sake of explanation, the nodes in FIG. 5 have been enumerated from 1 to 11 and the curve sections have been assigned letters A to R. Three types of nodes may be identified in FIG. 5, as below:
1. Nodes 1, 2, 8, 11 that connect two curve sections from the same boundary.
2. Nodes 3, 4, 5, 6, 7 that connect two curve sections from one boundary and two curve sections from the other boundary.
3. Nodes 9, 10 that connect connecting two curve sections from one boundary and two curve sections from the other boundary, where one pair of curve sections from both boundaries is collinearly overlapping.

The two curve sections P, R between the nodes 9, 10 correspond to the collinearly overlapping segments of the two lines $c_3$ and $c_6$ from the two boundaries b1 and b2. Although P and R have an infinite number of common points, for the sake of explanation, only their start and end point are included in the set of intersections (represented by Equation 17, above). Thus, only two different nodes 9 and 10 are indicated in FIG. 5.

Denoting by o(c)=(F, L), wherein the orientation of a curve c is from a node F at the first point on the curve c and a node L at the last point on the curve c, the orientation (in the counter-clockwise direction) of the curve sections are represented as below:
o(A)=(1,3) o(G)=(4,6) o(M)=(7,9)
o(B)=3,2) o(H)=(6,5) o(N)=(10,7)
o(C)=5,1) o(I)=(4,8) o(O)=(8,9)
o(D)=(2,4) o(J)=(7,6) o(P)=(9,10)
o(E)=(3,4) o(K)=(6,7) o(Q)=(10,11)
o(F)=(5,3) o(L(=(11,5) o(R)=(10,9)

The union of the boundaries is obtained by keeping the directions (counter-clockwise) of all curve sections, finding all pairs of connected curve sections at each node and then finding successor sections at each node for S=+1. The successors for each node may be as below:
node 1: A=σ(C) node 7: K=σ(J)
node 2: D=σ(B) node 8: O=σ(I)
node 3: B=σ(A) node 9: R=σ(O)
node 4: I=σ(D) node 10: Q=σ(R)
node 5: C=σ(L) node 11: L=σ(Q)
node 6: J=σ(K)

Based on these successor relations, the following two boundaries can be determined
{A,B,D,I,O,R,Q,L,C}
{J,K}

Figure 6A:
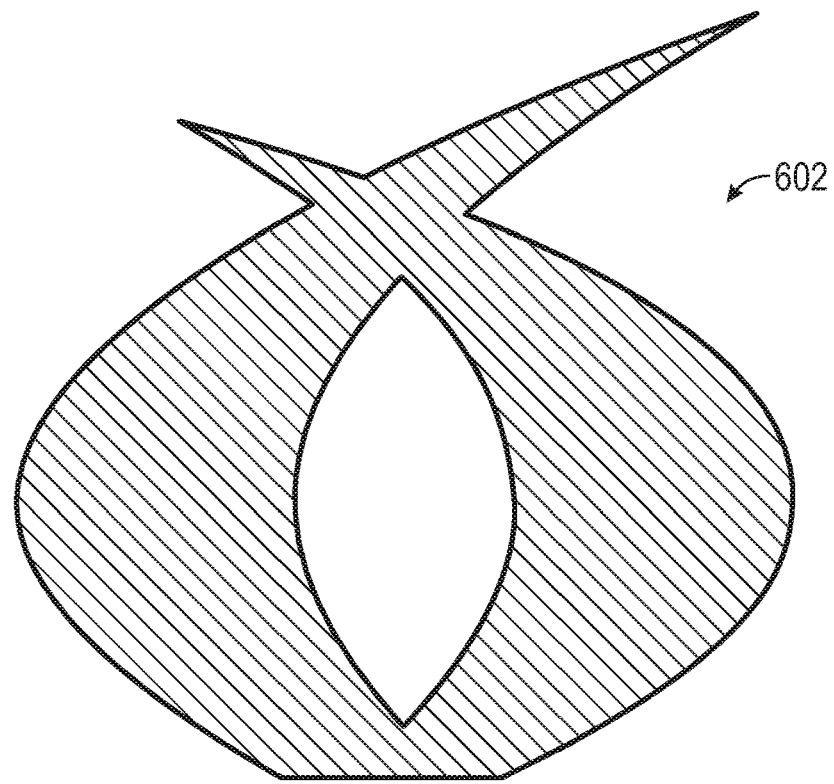
FIG. 6A illustrates the results of the union operation between the boundaries in FIG. 5.

FIG. 6A illustrates a result 602 of the union operation b1∪b2 between the boundaries b1 and b2. The result is a set of two boundaries, the first boundary b1 having a positive area 2856.50 and thus counter-clockwise orientation, and the second boundary b2 having a negative area −547.71 and thus clockwise orientation. The first boundary b1 is illustrated by the shaded portion and the second boundary b2 is a hole (void) entirely contained within the first boundary b1. The area of the first boundary b1 without the hole is equal to the difference of the two areas, i.e. 2308.79.

The intersection of the boundaries is obtained by keeping the directions (counter-clockwise) of all curve sections, finding all pairs of connected curve sections at each node and then finding successor sections at each node for S=−1. The successors for each node for an intersection operation may be as below:
node 1: A=σ(C) node 7: M=σ(N)
node 2: D=σ(B) node 8: O=σ(I)
node 3: E=σ(F) node 9: R=σ(M)
node 4: G=σ(E) node 10: N=σ(R)
node 5: F=σ(H) node 11: L=σ(Q)
node 6: H=σ(G)

Based on these successor relations, the following two boundaries can be determined
{E, G, H, F}
{M, R, N}

Figure 6B:
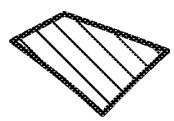
FIG. 6B illustrates the results of the intersection operation between the boundaries in FIG. 5.
Figure 6B:

FIG. 6B illustrates a result 604 of the intersection operation b1∩b2 between the boundaries b1 and b2. The result is a set of two boundaries with positive areas 20.86 and 56.84, respectively, and thus counter-clockwise orientation.

The difference b1\b2 is obtained by reversing the orientation of curve sections {B, D, G, K, M, P, Q, L, F} belonging to the boundary b2 and finding all pairs of connected curve sections at each node and then finding successor sections at each node for S=−1. After the orientation of the curve section P has been reversed, P and R represent a connected pair of curve sections, which however is disregarded since the absolute value of the angle between their tangents is π. For the remaining connected pairs of curve sections, the successors for each node for a difference operation may be as below:
node 1: A=σ(C) node 7: J=σ(M)
node 2: B=σ(D) node 8: O=σ(I)

node 3: F=σ(A) node 9: M=σ(O)
node 4: I=σ(G) node 10: N=σ(Q)
node 5: C=σ(F) node 11: Q=σ(L)
node 6: G=σ(J)

Based on these successor relations, the following two boundaries can be determined
{A,F,C}
{I,O,M,J,G}

Figure 6C:
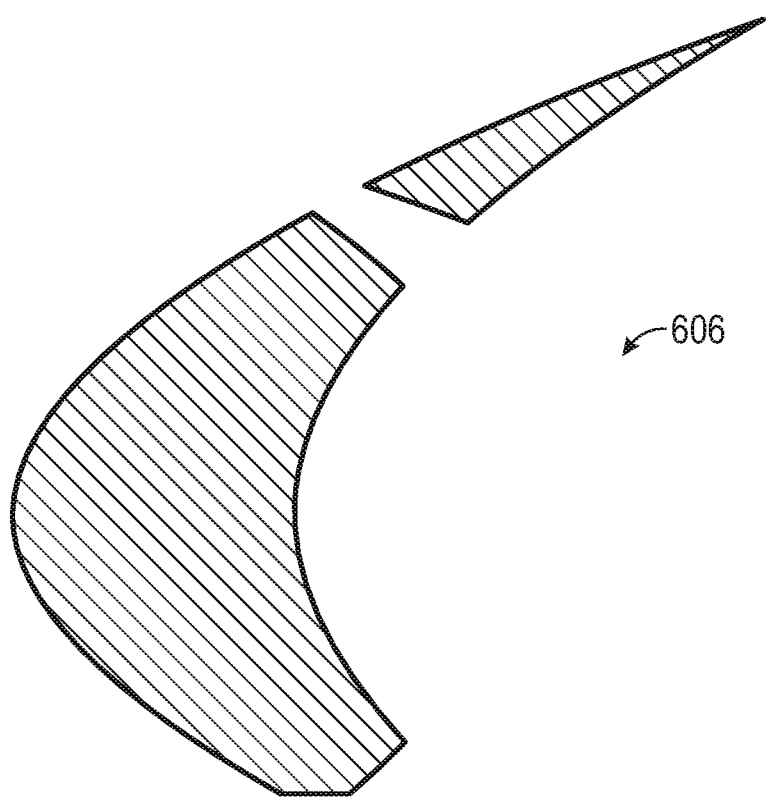
FIG. 6C illustrates the results of the difference operation between the boundaries in FIG. 5.

FIG. 6C illustrates a result 606 of the difference operation b1\b2 between the boundaries b1 and b2. The result is a set of two boundaries with areas 1053.07 and 115.14, respectively, and thus oriented counter-clockwise.

The difference b2\b1 is obtained by reversing the orientation of curve sections {A,E,I,O,R,N,J,H,C} belonging to the boundary b1 and finding all pairs of connected curve sections at each node and then finding successor sections at each node for S=−1. After the orientation of the curve section R has been reversed, P and R represent a connected pair of curve sections, which however is disregarded since the absolute value of the angle between their tangents is π. For the remaining connected pairs of curve sections, the successors for each node for a difference operation may be as follows:
node 1: C=σ(A) node 7: N=σ(K)
node 2: D=σ(B) node 8: I=σ(O)
node 3: B=σ(E) node 9: M=σ(P)
node 4: E=σ(D) node 10: Q=σ(N)
node 5: H=σ(L) node 11: L=σ(Q)
node 6: K=σ(H)

Based on these successor relations, the following two boundaries can be determined
{B,D,E}
{H,K,N,Q,L}

Figure 6D:
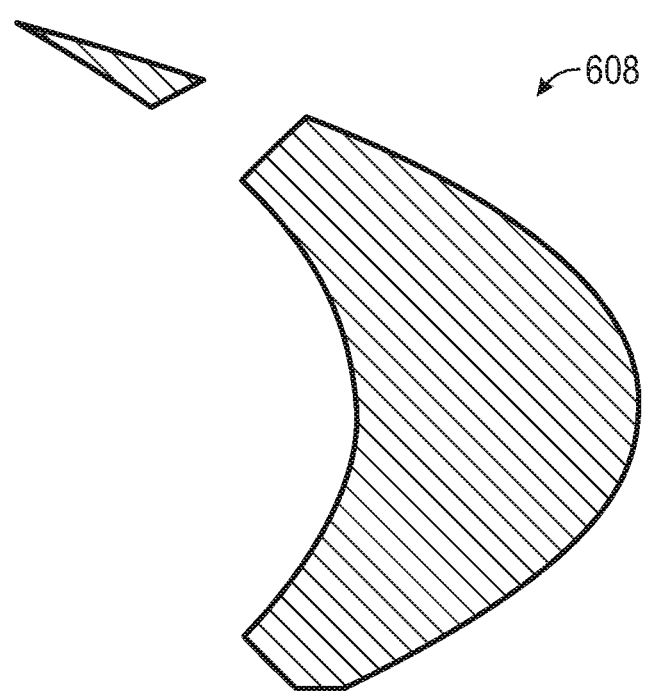
FIG. 6D illustrates shows the results of the difference operation between the boundaries in FIG. 5.

FIG. 6D illustrates a result 608 of the difference operation b2\b1 between the boundaries b1 and b2. The result is a set of two boundaries with areas 1028.93 and 33.96, respectively, and thus oriented counter-clockwise.

The Boolean operations, as discussed above, result in planar geometric shapes (illustrated, for instance, in FIGS. 6A-6D) which correspond to patterns of metal, oxide, semiconductor layers, and the like that make up the different features in the integrated circuit. The different features in the integrated circuit may include, for example, the different circuit components (e.g., transistors) of the integrated circuit, interconnections between the different circuit components, interconnects between different layers, shapes of different circuit components, such as, components used to implement silicon photonics technology in ICs, components used in microelectromechanical systems (MEMS), microfluidics devices, and the like.

The method as discussed above was directed to single Boolean operations between the boundaries b1 and b2. The method, according to example embodiments, may also be used to perform multiple (or nested) Boolean operations between the two or more boundaries.

Figure 7A:
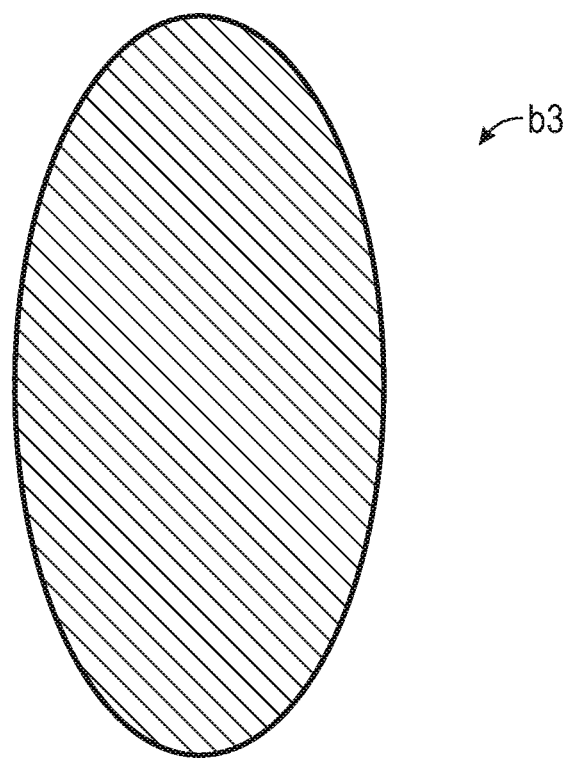
FIGS. 7A and 7B illustrate two example boundaries, each including an elliptical shape.
Figure 7B:
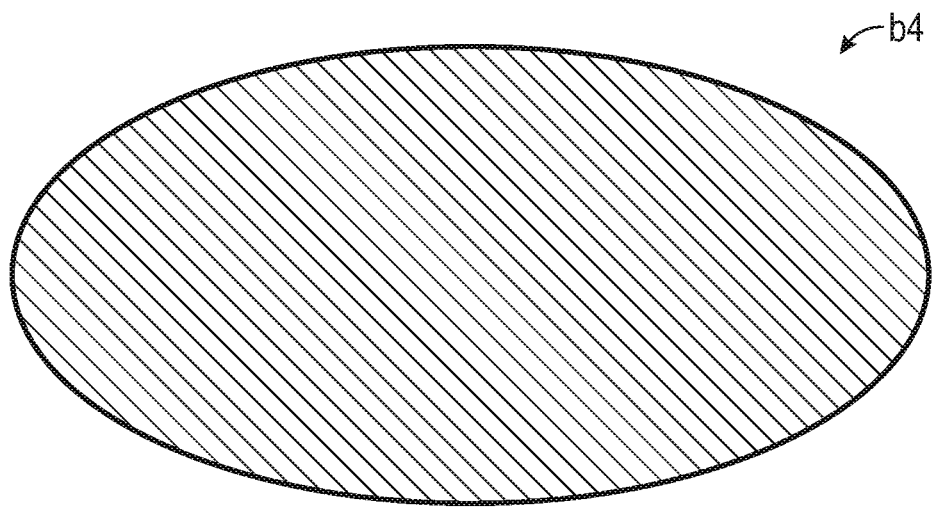
Figure 7C:
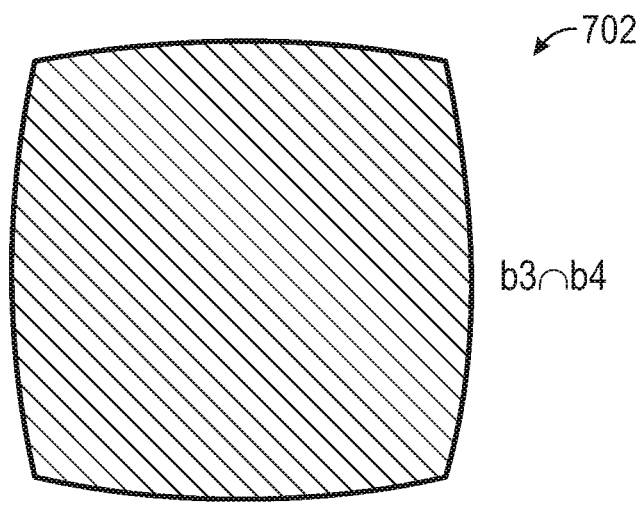
FIG. 7C illustrates results of an example intersection operation between boundaries in FIGS. 7A and 7B.

FIGS. 7A and 7B illustrate two example boundaries b3 and b4, respectively, each including of an elliptical shape. FIG. 7C illustrates a result 702 of an example intersection operation between b3 and b4.

Figure 8A:
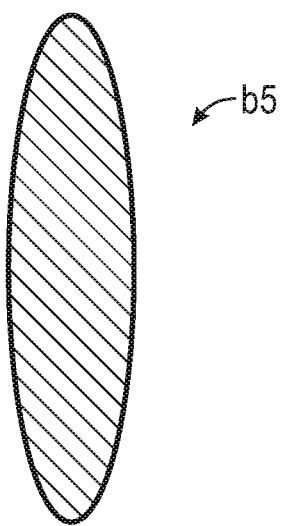
FIGS. 8A and 8B illustrate two example boundaries, each including an elliptical shape.
Figure 8B:
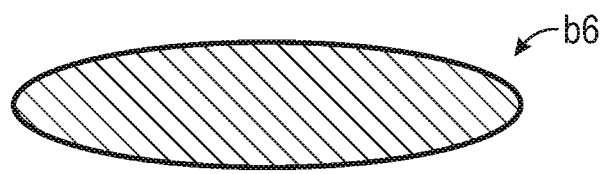
Figure 8C:
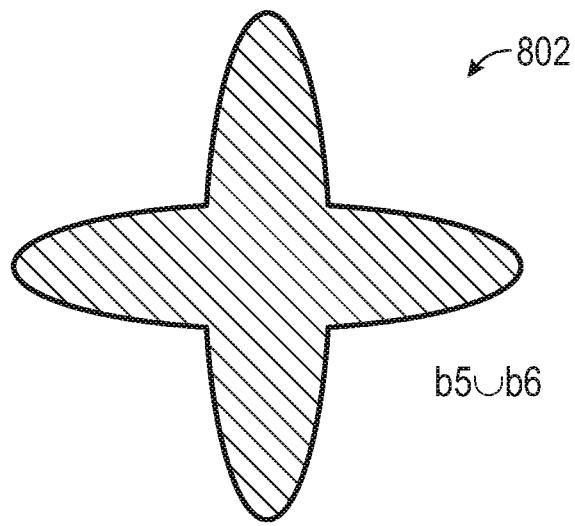
FIG. 8C illustrates the results of an example union operation between boundaries in FIGS. 8A and 8B.

FIGS. 8A and 8B illustrate two example boundaries b5 and b6, respectively, each including an elliptical shape. FIG. 8C illustrates a result 802 of an example union operation between b5 and b6.

Figure 9A:
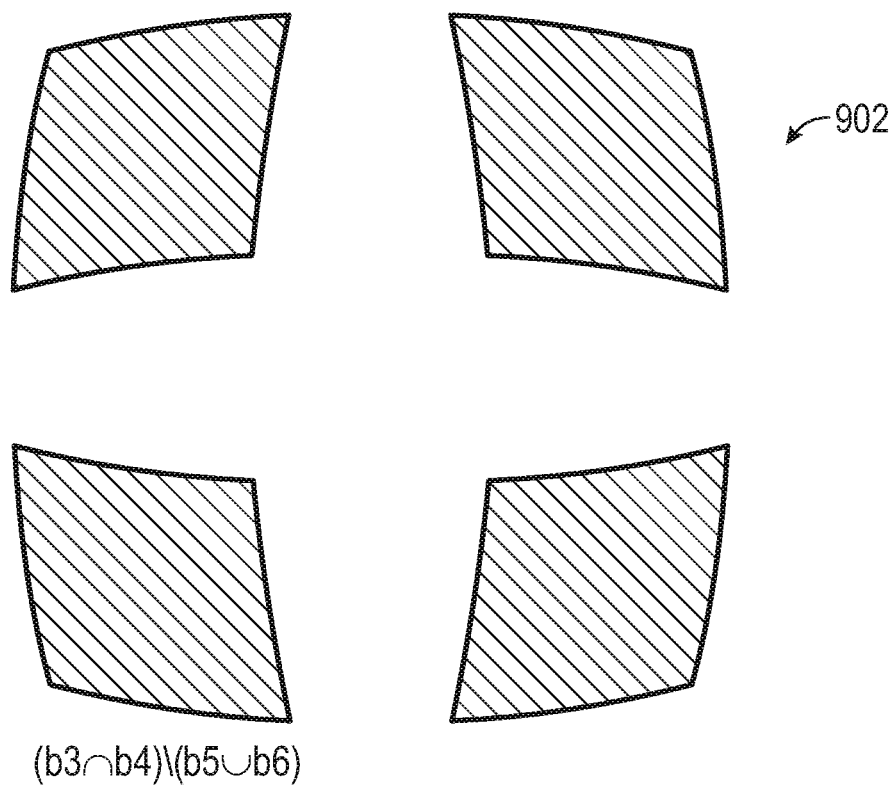
FIG. 9A illustrates a result of an example nested Boolean operation between the boundaries illustrated in FIGS. 7A, 7B, 8A, and 8B.
Figure 9B:
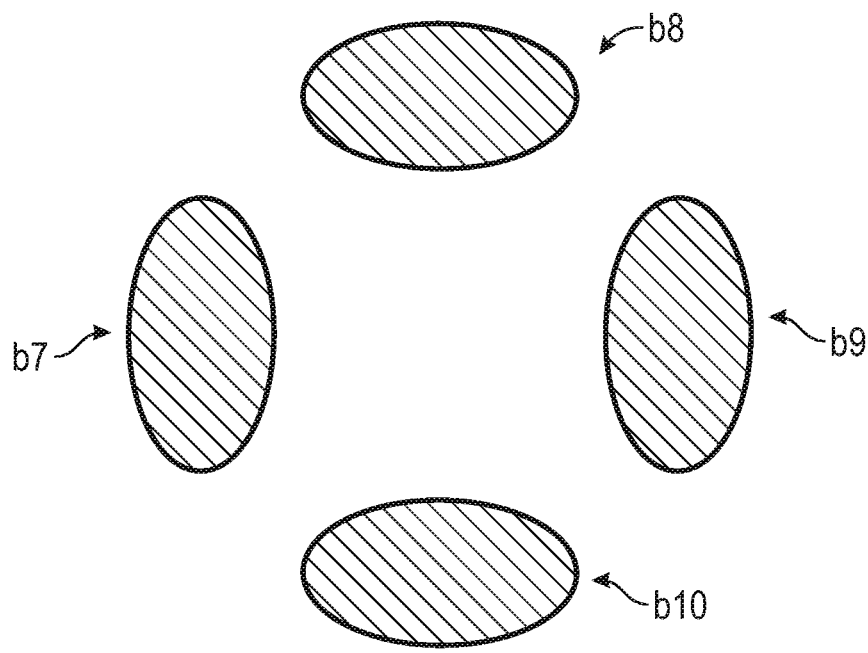
FIG. 9B illustrates example boundaries, each including an elliptical shape.
Figure 9C:
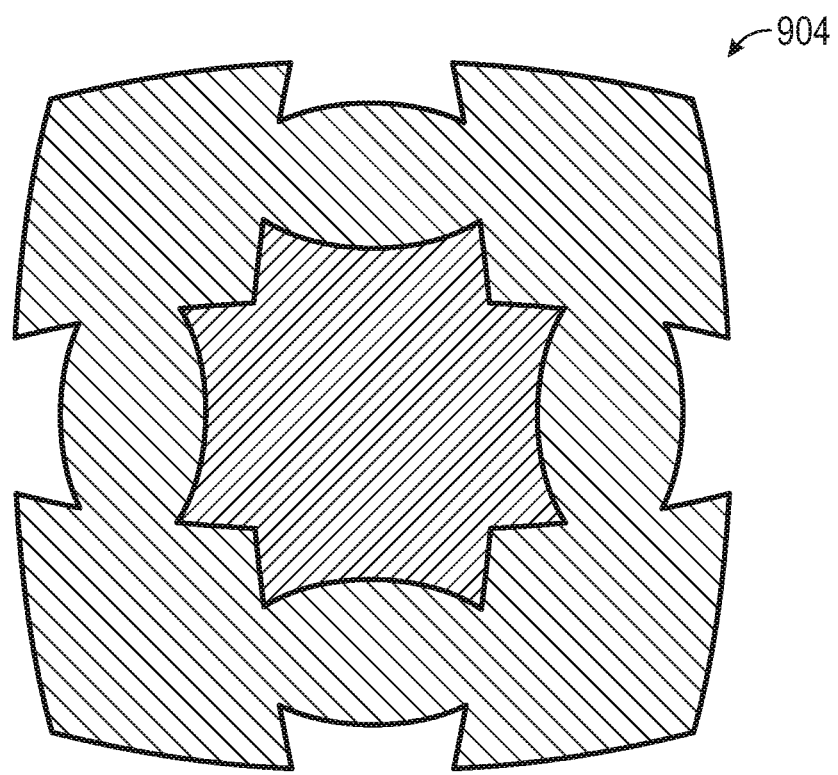
FIG. 9C illustrates the result of an example nested Boolean operation between the boundaries in FIGS. 7A, 7B, 8A, 8B, and 9B.

FIG. 9A illustrates a result 902 of a Boolean operation between the results of Boolean operation illustrated in FIGS. 7C and 8C. The Boolean operation of FIG. 9A is a nested Boolean operation and can be represented as (b3∩b4)\(b5∪b6). FIG. 9B illustrates example boundaries b7, b8, b9, b10. FIG. 9C illustrates a result 904 of nested Boolean operations between the result in FIG. 9A and the boundaries in FIG. 9B. The Boolean operation is a nested Boolean operation and is represented as ((b3∩b4)\(b5∪b6))∪b7∪b8∪b9∪b10.

Figure 10:
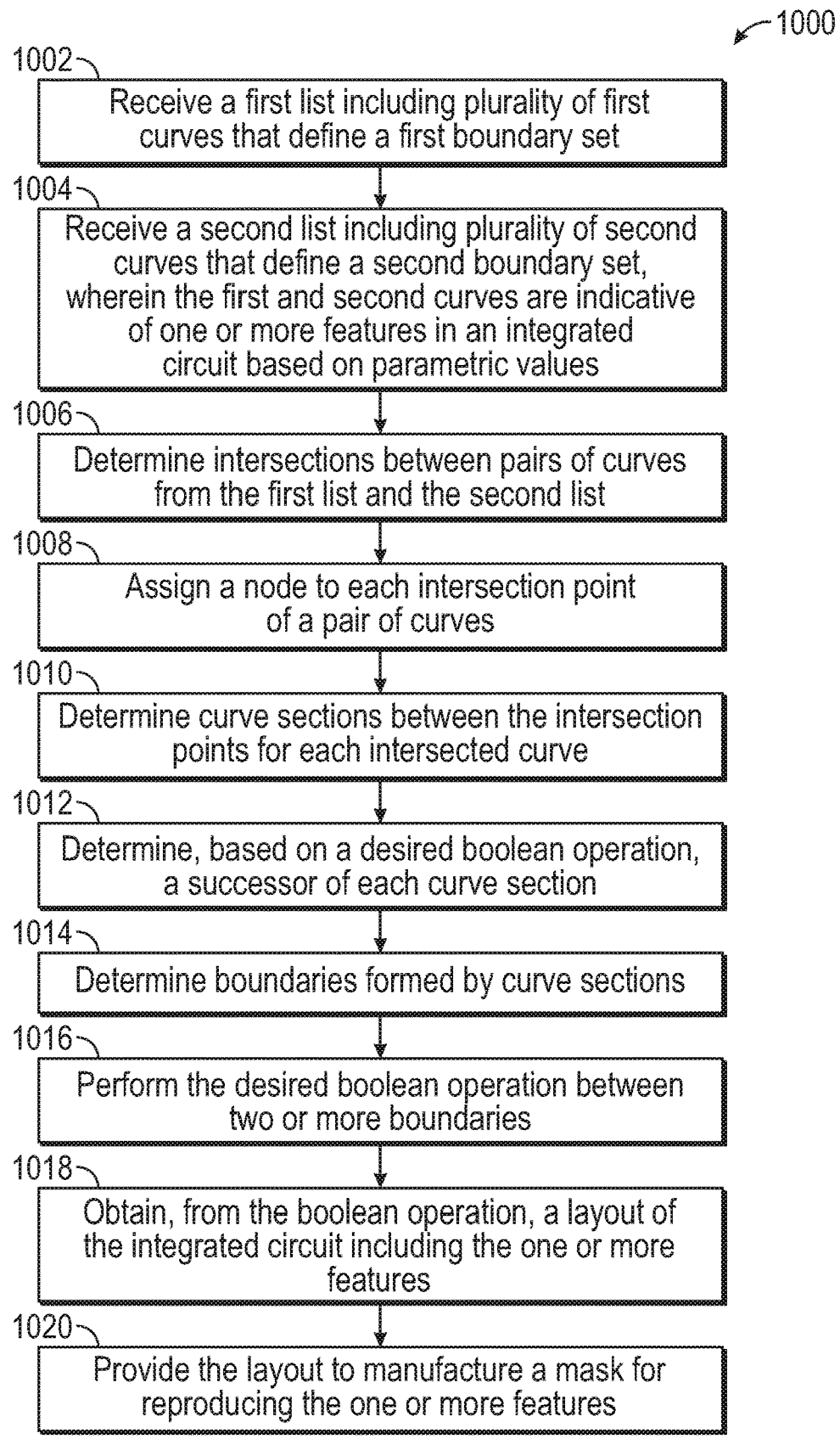
FIG. 10 is a flow chart illustrating steps in a method for performing Boolean operations on curves that form the curved boundaries of closed regions in a plane and are defined by parametric curve functions (or equations) as part of an IC manufacturing process, according to some embodiments

FIG. 10 is a flow chart illustrating steps in a method 1000 for performing Boolean operations on curves that form the curved boundaries of closed regions in a plane and are defined by parametric curve functions (or equations) as part of an IC manufacturing process, according to some embodiments. At least some of the steps in method 1000 may be performed by a computer having a processor executing commands stored in a memory of the computer (e.g., processors 1212 and 1236, memories 1220 and 1232, FIG. 12). Further, steps as disclosed in method 1000 may include retrieving, editing, and/or storing files in a database that is part of, or is communicably coupled to, the computer (e.g., database 1252). Methods consistent with the present disclosure may include at least some, but not all, of the steps illustrated in method 1000, performed in a different sequence. Furthermore, methods consistent with the present disclosure may include at least two or more steps as in method 1000, performed overlapping in time, or almost simultaneously.

In some embodiments, at least one or more of the steps in method 1000 may be performed in a cloud computing environment, wherein a computer may include servers, such as a master server and a slave server. Accordingly, at least some of the steps illustrated in method 1000 may be performed in parallel in different processors, following separate computational threads. For example, each of the separate computational threads may be performed by at least one of the slave servers in each of multiple applications and processors dedicated to the specific computational thread The method 1000 includes receiving a first list including a plurality of first curves that define a first boundary set, as at 1002, and receiving a second list including a plurality of second curves that define a second boundary set, as at 1004. The first and second curves are indicative of one or more features in an integrated circuit based on parametric values. The method 1000 further includes determining intersections between pairs of curves from the first list and the second list, as at 1006, assigning a node to each intersection point of a pair of curves, as at 1008, determining curve sections between the intersection points for each intersected curve, as at 1010, and determining, based on a desired Boolean operation, a successor of each curve section, as at 1012. The method 1000 further includes determining boundaries formed by the curve sections, as at 1014, performing the desired Boolean operation between two or more boundaries, as at 1016, obtaining, from the Boolean operation, a layout of the integrated circuit including the one or more features, as at 1018, and providing the layout to manufacture a mask for reproducing the one or more features, as at 1020.

Figure 11:
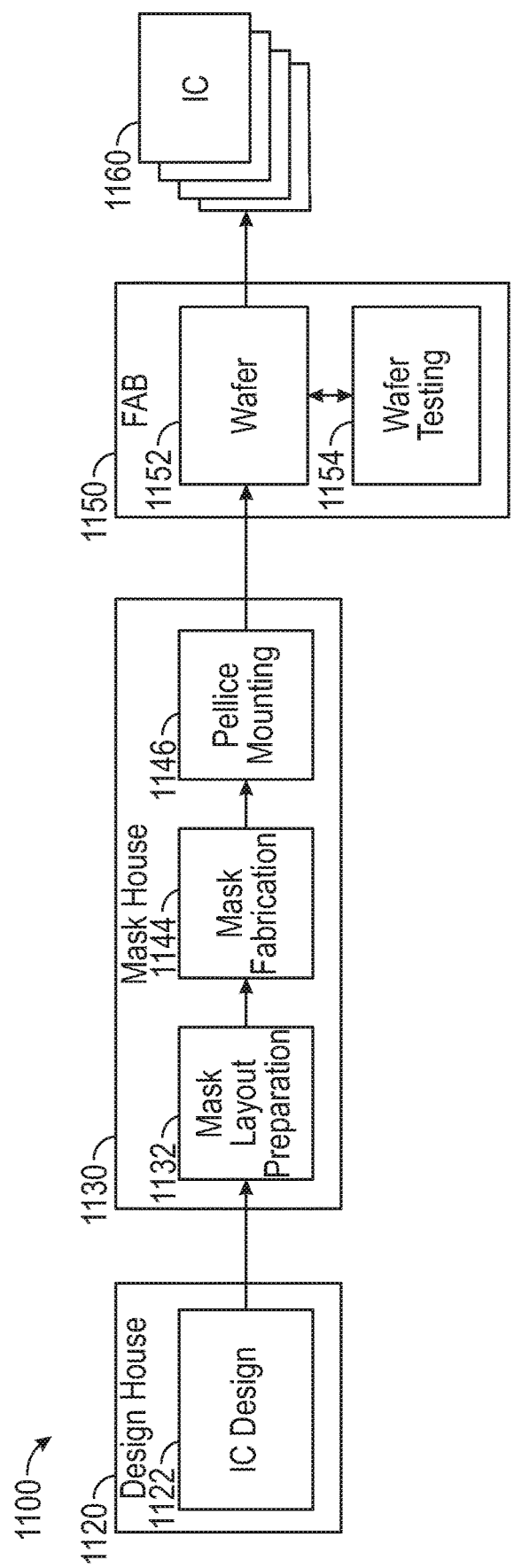
FIG. 11 is a schematic block diagram of an embodiment of an integrated circuit (IC) manufacturing system and an IC manufacturing flow associated with the IC manufacturing system.

FIG. 11 is a schematic block diagram of an embodiment of an integrated circuit (IC) manufacturing system 1100 and an IC manufacturing flow associated with the IC manufacturing system. The IC manufacturing system 1100 includes a plurality of entities, such as a design house 1120, a mask house 1130, and an IC manufacturer 1150 (i.e., a fab), that interact with one another in the design, development, and manufacturing cycles and/or services related to manufacturing an integrated circuit (IC) device 1160. The plurality of entities are connected by a communications network, which may be a single network or a variety of different networks, such as an intranet and the Internet, and may include wired and/or wireless communication channels. Each entity may interact with other entities and may provide services to and/or receive services from the other entities. The design house 1120, mask house 1130, and IC manufacturer 1150 may be a single entity or separate entities.

The design house (or design team) 1120 generates an IC design layout 1122. The IC design layout 1122 includes various geometrical patterns designed for an IC product, based on a specification of the IC product to be manufactured. The geometrical patterns correspond to patterns of metal, oxide, or semiconductor layers that make up the various components of the IC device 1160 to be fabricated. The various layers combine to form various IC features. For example, a portion of the IC design layout 1122 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. The design house 1120 implements a proper design procedure to form the IC design layout 1122. The design procedure may include logic design, physical design, and/or place and route. The IC design layout 1122 is presented in one or more data files having information of the geometrical patterns. For example, the IC design layout 1122 can be expressed in a GDSII file format (or DFII file format).

The mask house 1130 uses the IC design layout 1122 to manufacture one or more masks to be used for fabricating the various layers of the IC product according to the IC design layout 1122. The mask house 1130 performs mask layout preparation 1132, where the IC design layout 1122 is translated into a form that can be physically written by a mask writer. Commonly, an IC design may be replicated multiple times on a mask such that when radiation is passed through the mask during photolithography multiple copies of the IC design (or dies) may be formed within a single exposure field (or region) of a semiconductor wafer. As an aspect of this, during mask layout preparation 1132, the layout of the mask design may be determined including the location and number of dies to be formed within an exposure field, the location and width of scribe line regions (scribe lanes) around the dies, and the location and type of test structures to be formed on the wafer.

Additionally, mask layout preparation 1132 may include optical proximity correction (OPC) and a lithography process check (LPC) on the IC design layout 1122 to compensate for image errors and simulate mask fabrication. The mask house 1130 also performs mask fabrication 1144, where the design layout prepared by the mask layout preparation 1132 is modified to comply with a particular mask writer and/or mask manufacturer and is then fabricated. In the present embodiment, the mask layout preparation 1132 and mask fabrication 1144 are illustrated as separate elements, however, the mask layout preparation 1132 and mask fabrication 1144 can be collectively referred to as mask data preparation.

During mask fabrication 1144, a mask or group of masks are fabricated based on the mask design layout which incorporates one or more copies of the IC design layout 1122 as modified by mask layout preparation 1132. For example, an electron-beam (e-beam) or a mechanism of multiple e-beams is used to form a pattern on a mask (photomask or reticle) based on the mask design layout. The mask can be formed in various technologies. In one embodiment, the mask is formed using binary technology. In the present embodiment, a mask pattern includes opaque regions and transparent regions. A radiation beam, such as an ultraviolet (UV) beam, used to expose the image sensitive material layer (e.g., photoresist) coated on a wafer, is blocked by the opaque region and transmits through the transparent regions. In one example, a binary mask includes a transparent substrate (e.g., fused quartz) and an opaque material (e.g., chromium) coated in the opaque regions of the mask. In another example, the mask is formed using a phase shift technology. In the phase shift mask (PSM), various features in the pattern formed on the mask are configured to have proper phase difference to enhance the resolution and imaging quality. In various examples, the phase shift mask can be attenuated PSM or alternating PSM as known in the art.

After a mask has been fabricated, the mask house performs a mask inspection to determine if the fabricated mask includes any defects, such as full-height and non-full-height defects. If any defects are detected, the mask may be cleaned or the mask design layout and/or IC design may be modified further depending on the types of defects detected.

If a mask passes inspection, it undergoes a pellicle mounting process 1146. Specifically, during the pellicle mounting 1146, a pellicle is secured to the mask to prevent particles from falling onto the mask pattern and causing defects during subsequent lithography processes. A pellicle typically includes a thin film stretched across a frame that is secured to the mask by an adhesive or other semi-permanent or permanent fastener. The frame holds the film a distance above the mask pattern such that particles deposited on the film will be out of focus during illumination of the mask.

It should be understood that the above description of the mask layout preparation 1132 has been simplified for the purposes of clarity, and layout preparation may include additional features such as a logic operation (LOP) to modify the IC design layout according to manufacturing rules, a retarget process (RET) to modify the IC design layout to compensate for limitations in lithographic processes used by IC manufacturer 1150, and a mask rule check (MRC) to modify the IC design layout to compensate for limitations during mask fabrication 1144. Additionally, the processes applied to the IC design layout 1122 during mask fabrication 1144 and mask inspection may be executed in a variety of different orders and may include a variety of different and/or additional steps.

The IC manufacturer 1150, such as a semiconductor foundry, uses the mask (or masks) fabricated by the mask house 1130 to fabricate a semiconductor wafer 1152 having a plurality of the IC devices 1160 thereon. The IC manufacturer 1150 is an IC fabrication business that can include a myriad of manufacturing facilities for the fabrication of a variety of different IC products. For example, there may be a manufacturing facility for the front end fabrication of a plurality of IC products (i.e., front-end-of-line (FEOL) fabrication), while a second manufacturing facility may provide the back end fabrication for the interconnection and packaging of the IC products (i.e., back-end-of-line (BEOL) fabrication), and a third manufacturing facility may provide other services for the foundry business. In the present embodiment, the semiconductor wafer 1152 is fabricated using the mask (or masks) to form a plurality of the IC devices 1160. The semiconductor wafer includes a silicon substrate or other proper substrate having material layers formed thereon. Other proper substrate materials include another suitable elementary semiconductor, such as diamond or germanium; a suitable compound semiconductor, such as silicon carbide, indium arsenide, or indium phosphide; or a suitable alloy semiconductor, such as silicon germanium carbide, gallium arsenic phosphide, or gallium indium phosphide. The semiconductor wafer may further include various doped regions, dielectric features, and multilevel interconnects (formed at subsequent manufacturing steps). The mask may be used in a variety of processes. For example, the mask may be used in an ion implantation process to form various doped regions in the semiconductor wafer, in an etching process to form various etching regions in the semiconductor wafer, in a deposition process (e.g., chemical vapor deposition (CVD) or physical vapor deposition (PVD)) to form a thin film in various regions on the semiconductor wafer, and/or other suitable processes. Further, during a photolithography process, light is passed though the mask (and pellicle) so as to transfer the pattern on the mask to the semiconductor wafer.

After a semiconductor wafer 1152 has been fabricated it may be subjected to wafer testing 1154 to ensure the integrated circuits formed thereon conform to physical manufacturing specifications and electrical performance specifications. After the wafer 1152 passes wafer testing 1154, it may be diced (or sliced) along scribe lines to separate the IC devices 1160 formed thereon. The dicing process can be accomplished by scribing and breaking, by mechanical sawing (e.g., with a dicing saw) or by laser cutting. Following the dicing process, the plurality of IC devices 1160 are individually packaged for use in building electronic devices and, in some embodiments, may be subjected to further individual testing.

Figure 12:
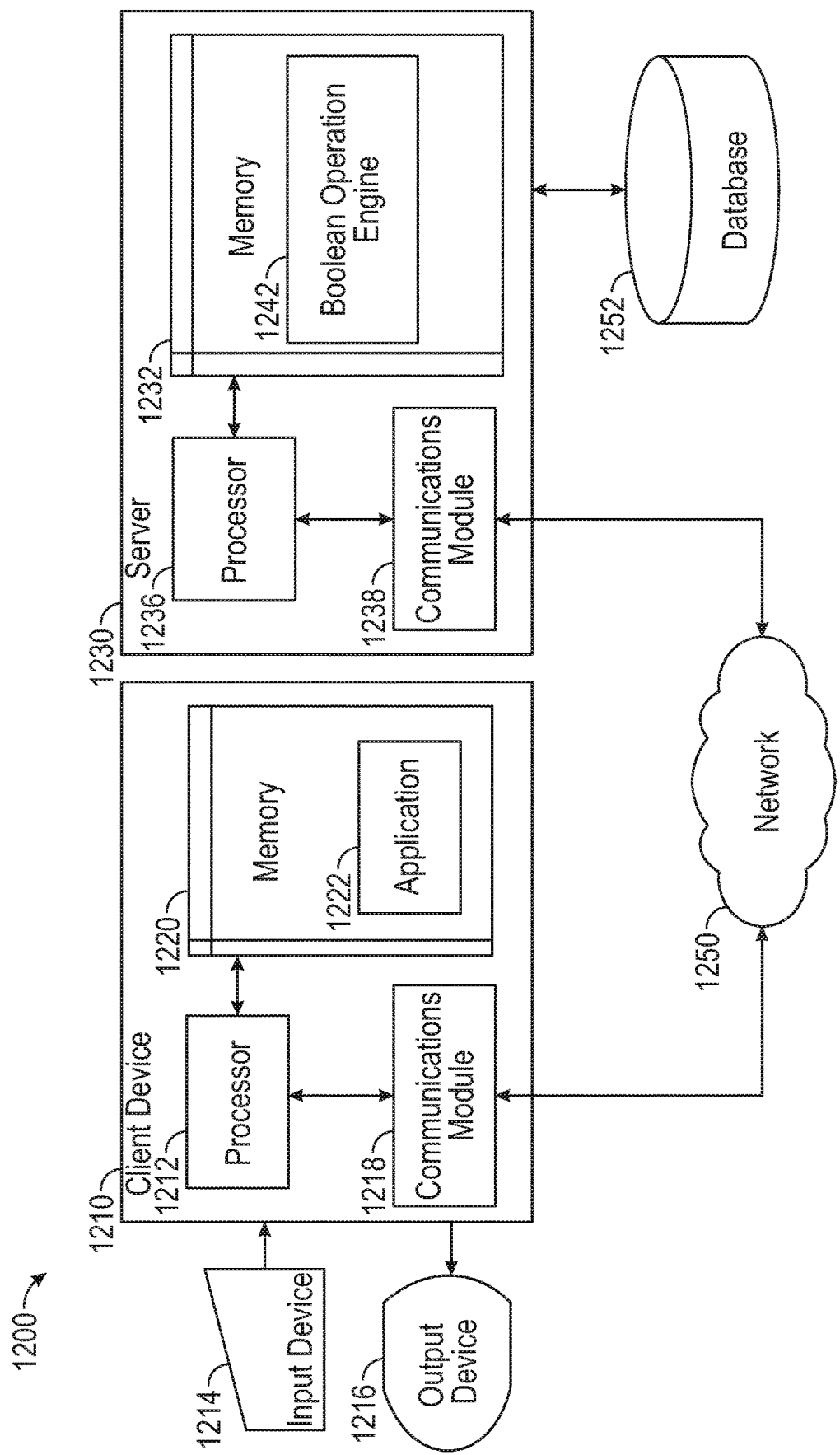
FIG. 12 illustrates an example architecture, including systems to perform Boolean operations on curves that form the curved boundaries of closed regions in a plane and are defined by parametric curve functions (or equations) as part of an IC manufacturing process, according to some embodiments.

FIG. 12 illustrates an architecture 1200, including systems to perform Boolean operations on curves that form the curved boundaries of closed regions in a plane and are defined by parametric curve functions (or equations) as part of an IC manufacturing process, according to some embodiments. A client device 1210 includes a processor 1212 configured to execute instructions stored in a memory 1220. Memory 1220 may include an application 1222, which includes commands that when executed by processor 1212 cause client device 1210 to perform methods consistent with the present disclosure. Application 1222 may include a runtime software program running on client device 1210 to issue commands to server 1230 for controlling a Boolean operation engine 1242 (implemented in hardware and/or software, as appropriate). For example, in some embodiments, the user may provide a parametric curve, r(t) to server 1230 via application 1222, wherein the parametric curve, r(t), is indicative of a feature (e.g., layout) of an IC circuit. Server 1230 may be configured to provide to client device 1210 a set of points that are the vertices of a segmented curve representative of the feature in the IC circuit, so that application 1222 may provide a layout for reproducing on a fabrication mask (or reticle). The mask may then be used in the fabrication of the IC circuit, including the desired feature.

Client device 1210 may also include a communications module 1218 that enables client device 1210 to transfer data, provide commands, and receive instructions from server 1230 through a network 1250. Client device 1210 may be coupled with an input device 1214 (e.g., a mouse, a keyboard, a touch screen display, and the like) and an output device 1216 (e.g., a display, a speaker, and the like). Accordingly, a user may enter commands and queries to client device 1210 with input device 1214, and receive graphic and other information from client device 1210 via output device 1216. In some embodiments, application 1222 may control input device 1214 and output device 1216 through a graphic user interface (GUI), enabling a user to have access to server 1230.

Server 1230 may include a memory 1232, a processor 1236, and a communications module 1238 to transfer data, receive commands, and provide instructions from client device 1210 through network 1250. Memory 1232 and processor 1236 may be communicatively coupled with the Boolean operation engine 1242, as disclosed herein.

Database 1252 may store, or the user may provide via client device 1210, multiple parametric curves, $r_k(t)$, to the Boolean operation engine 1242. The Boolean operation engine 1242 is configured to perform Boolean operations according to at least some of the embodiments disclosed herein.

Figure 13:
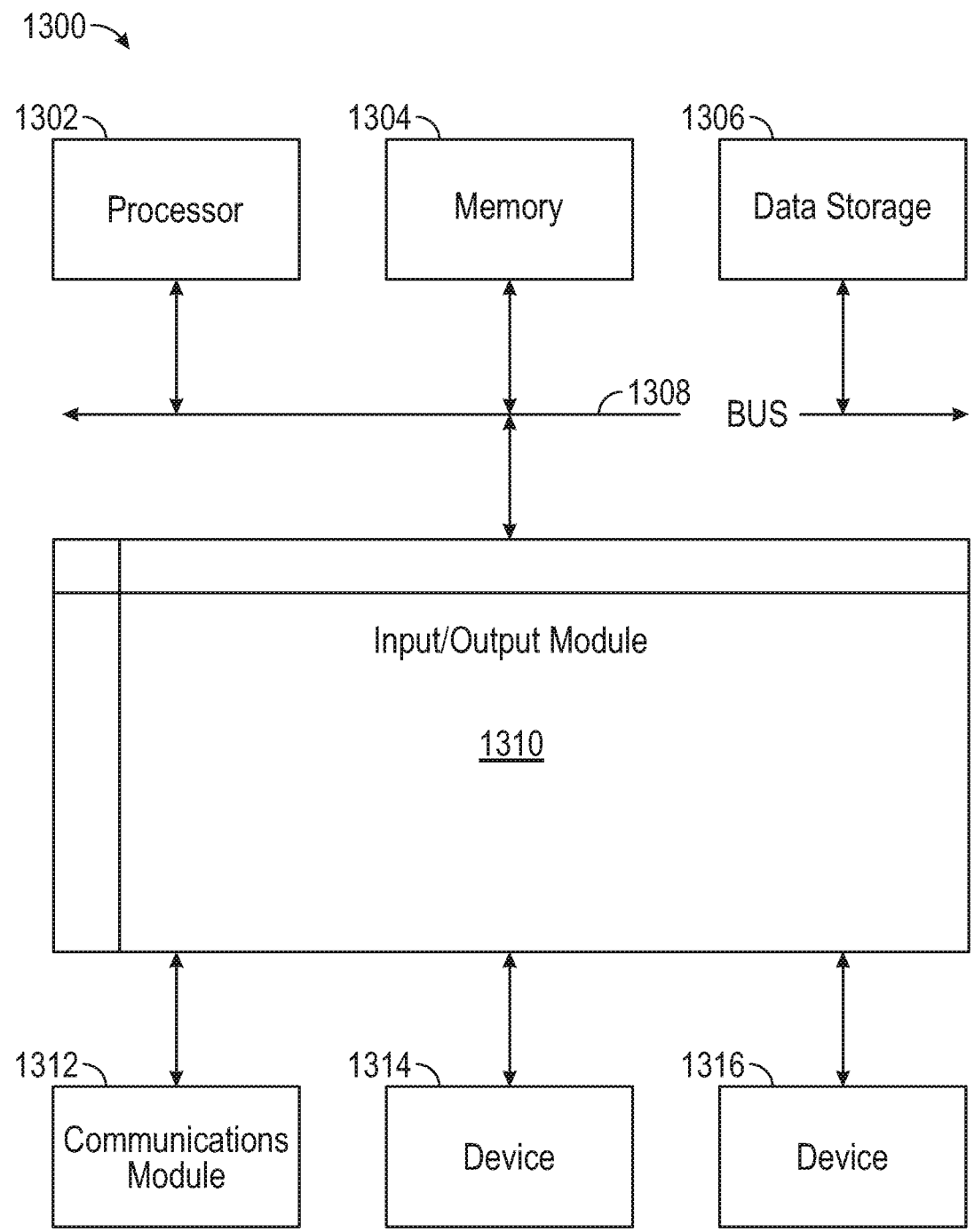
FIG. 13 is a block diagram illustrating an example computer system, according to some embodiments.

FIG. 13 is a block diagram illustrating an example computer system 1300 with which the methods and steps illustrated in FIG. 10 can be implemented, according to some embodiments. In certain aspects, computer system 1300 can be implemented using hardware or a combination of software and hardware, either in a dedicated server, integrated into another entity, or distributed across multiple entities.

Computer system 1300 includes a bus 1308 or other communication mechanism for communicating information, and a processor 1302 coupled with bus 1308 for processing information. By way of example, computer system 1300 can be implemented with one or more processors 1302. Processor 1302 can be a general-purpose microprocessor, a microcontroller, a Digital Signal Processor (DSP), an Application Specific Integrated Circuit (ASIC), a Field Programmable Gate Array (FPGA), a Programmable Logic Device (PLD), a controller, a state machine, gated logic, discrete hardware components, or any other suitable entity that can perform calculations or other manipulations of information. In some embodiments, processor 1302 may include modules and circuits configured as a 'placing' tool or engine, or a 'routing' tool or engine, to place devices and route channels in a circuit layout, respectively and as disclosed herein.

Computer system 1300 includes, in addition to hardware, code that creates an execution environment for the computer program in question, e.g., code that constitutes processor firmware, a protocol stack, a database management system, an operating system, or a combination of one or more of them stored in an included memory 1304, such as a Random Access Memory (RAM), a flash memory, a Read Only Memory (ROM), a Programmable Read-Only Memory (PROM), an Erasable PROM (EPROM), registers, a hard disk, a removable disk, a CD-ROM, a DVD, or any other suitable storage device, coupled to bus 1308 for storing information and instructions to be executed by processor 1302. Processor 1302 and memory 1304 can be supplemented by, or incorporated in, special purpose logic circuitry.

The instructions may be stored in memory 1304 and implemented in one or more computer program products, e.g., one or more modules of computer program instructions encoded on a computer readable medium for execution by, or to control the operation of, the computer system 1300, and according to any method well known to those of skill in the art, including, but not limited to, computer languages such as data-oriented languages (e.g., SQL, dBase), system languages (e.g., C, Objective-C, C++, Assembly), architectural languages (e.g., Java, .NET), and application languages (e.g., PHP, Ruby, Perl, Python). Instructions may also be implemented in computer languages such as array languages, aspect-oriented languages, assembly languages, authoring languages, command line interface languages, compiled languages, concurrent languages, curly-bracket languages, dataflow languages, data-structured languages, declarative languages, esoteric languages, extension languages, fourth-generation languages, functional languages, interactive mode languages, interpreted languages, iterative languages, list-based languages, little languages, logic-based languages, machine languages, macro languages, metaprogramming languages, multiparadigm languages, numerical analysis languages, non-English-based languages, object-oriented class-based languages, object-oriented prototype-based languages, off-side rule languages, procedural languages, reflective languages, rule-based languages, scripting languages, stack-based languages, synchronous languages, syntax handling languages, visual languages, Wirth languages, embeddable languages, and xml-based languages. Memory 1304 may also be used for storing temporary variable or other intermediate information during execution of instructions to be executed by processor 1302.

A computer program as discussed herein does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, subprograms, or portions of code). A computer program can be deployed to be executed on one computer or on multiple computers that are located at one site or distributed across multiple sites and interconnected by a communication network. The processes and logic flows described in this specification can be performed by one or more programmable processors executing one or more computer programs to perform functions by operating on input data and generating output.

Computer system 1300 further includes a data storage device 1306 such as a magnetic disk or optical disk, coupled to bus 1308 for storing information and instructions.

Computer system 1300 is coupled via input/output module 1310 to various devices. The input/output module 1310 is any input/output module. Example input/output modules 1310 include data ports such as USB ports. The input/output module 1310 is configured to connect to a communications module 1312. Example communications modules 1312 include networking interface cards, such as Ethernet cards and modems. In certain aspects, the input/output module 1310 is configured to connect to a plurality of devices, such as an input device 1314 and/or an output device 1316. Example input devices 1314 include a keyboard and a pointing device, e.g., a mouse or a trackball, by which a user can provide input to the computer system 1300. Other kinds of input devices 1314 are used to provide for interaction with a user as well, such as a tactile input device, visual input device, audio input device, or brain-computer interface device. For example, feedback provided to the user can be any form of sensory feedback, e.g., visual feedback, auditory feedback, or tactile feedback; and input from the user can be received in any form, including acoustic, speech, tactile, or brain wave input. Example output devices 1316 include display devices, such as an LED (light emitting diode), CRT (cathode ray tube), or LCD (liquid crystal display) screen, for displaying information to the user.

Methods as disclosed herein may be performed by computer system 1300 in response to processor 1302 executing one or more sequences of one or more instructions contained in memory 1304. Such instructions may be read into memory 1304 from another machine-readable medium, such as data storage device 1306. Execution of the sequences of instructions contained in main memory 1304 causes processor 1302 to perform the process steps described herein (e.g., as in methods). One or more processors in a multi-processing arrangement may also be employed to execute the sequences of instructions contained in memory 1304. In alternative aspects, hard-wired circuitry may be used in place of, or in combination with, software instructions to implement various aspects of the present disclosure. Thus, aspects of the present disclosure are not limited to any specific combination of hardware circuitry and software.

Various aspects of the subject matter described in this specification can be implemented in a computing system that includes a back end component, e.g., as a data server, or that includes a middleware component, e.g., an application server, or that includes a front end component, e.g., a client computer having a graphical user interface or a Web browser through which a user can interact with an implementation of the subject matter described in this specification, or any combination of one or more such back end, middleware, or front end components. The components of the system can be interconnected by any form or medium of digital data communication, e.g., a communication network. The communication network can include, for example, any one or more of a personal area network (PAN), a local area network (LAN), a campus area network (CAN), a metropolitan area network (MAN), a wide area network (WAN), a broadband network (BBN), the Internet, and the like. Further, the communication network can include, but is not limited to, for example, any one or more of the following network topologies, including a bus network, a star network, a ring network, a mesh network, a star-bus network, tree or hierarchical network, or the like. The communications modules can be, for example, modems or Ethernet cards.

Computing system 1300 includes servers and personal computer devices. A personal computing device and server are generally remote from each other and typically interact through a communication network. The relationship of client and server arises by virtue of computer programs running on the respective computers and having a client-server relationship to each other. Computer system 1300 can be, for example, and without limitation, a desktop computer, laptop computer, or tablet computer. Computer system 1300 can also be embedded in another device, for example, and without limitation, a mobile telephone, a personal digital assistant (PDA), a mobile audio player, a Global Positioning System (GPS) receiver, a video game console, and/or a television set top box.

The term "machine-readable storage medium" or "computer readable medium" as used herein refers to any medium or media that participates in providing instructions or data to processor 1302 for execution. Such a medium may take many forms, including, but not limited to, non-volatile media, volatile media, and transmission media. Non-volatile media include, for example, optical disks, magnetic disks, or flash memory, such as data storage device 1306. Volatile media include dynamic memory, such as memory 1304. Transmission media include coaxial cables, copper wire, and fiber optics, including the wires that include bus 1308. Common forms of machine-readable media include, for example, floppy disk, a flexible disk, hard disk, magnetic tape, any other magnetic medium, a CD-ROM, DVD, any other optical medium, punch cards, paper tape, any other physical medium with patterns of holes, a RAM, a PROM, an EPROM, a FLASH EPROM, any other memory chip or cartridge, or any other medium from which a computer can read. The machine-readable storage medium can be a machine-readable storage device, a machine-readable storage substrate, a memory device, a composition of matter effecting a machine-readable propagated signal, or a combination of one or more of them.

In one aspect, a method may be an operation, an instruction, or a function and vice versa. In one aspect, a clause or a claim may be amended to include some or all of the words (e.g., instructions, operations, functions, or components) recited in either one or more clauses, one or more words, one or more sentences, one or more phrases, one or more paragraphs, and/or one or more claims.

To illustrate the interchangeability of hardware and software, items such as the various illustrative blocks, modules, components, methods, operations, instructions, and algorithms have been described generally in terms of their functionality. Whether such functionality is implemented as hardware, software, or a combination of hardware and software depends upon the particular application and design constraints imposed on the overall system. Skilled artisans may implement the described functionality in varying ways for each particular application.

As used herein, the phrase "at least one of" preceding a series of items, with the terms "and" or "or" to separate any of the items, modifies the list as a whole, rather than each member of the list (e.g., each item). The phrase "at least one of" does not require selection of at least one item; rather, the phrase allows a meaning that includes at least one of any one of the items, and/or at least one of any combination of the items, and/or at least one of each of the items. By way of example, the phrases "at least one of A, B, and C" or "at least one of A, B, or C" each refer to only A, only B, or only C; any combination of A, B, and C; and/or at least one of each of A, B, and C.

In one aspect, a term field effect transistor (FET) may refer to any of a variety of multi-terminal transistors generally operating on the principals of controlling an electric field to control the shape and hence the conductivity of a channel of one type of charge carrier in a semiconductor material, including, but not limited to, a metal oxide semiconductor field effect transistor (MOSFET), a junction FET (JFET), a metal semiconductor FET (MESFET), a high electron mobility transistor (HEMT), a modulation doped FET (MODFET), an insulated gate bipolar transistor (IGBT), a fast reverse epitaxial diode FET (FREDFET), and an ion-sensitive FET (ISFET).

To the extent that the term "include," "have," or "the like" is used in the description or the claims, such term is intended to be inclusive in a manner similar to the term "comprise" as "comprise" is interpreted when employed as a transitional word in a claim.

The word "exemplary" is used herein to mean "serving as an example, instance, or illustration." Any embodiment described herein as "exemplary" is not necessarily to be construed as preferred or advantageous over other embodiments. Phrases such as an aspect, the aspect, another aspect, some aspects, one or more aspects, an implementation, the implementation, another implementation, some implementations, one or more implementations, an embodiment, the embodiment, another embodiment, some embodiments, one or more embodiments, a configuration, the configuration, another configuration, some configurations, one or more configurations, the subject technology, the disclosure, the present disclosure, other variations thereof and alike are for convenience and do not imply that a disclosure relating to such phrase(s) is essential to the subject technology or that such disclosure applies to all configurations of the subject technology. A disclosure relating to such phrase(s) may apply to all configurations, or one or more configurations. A disclosure relating to such phrase(s) may provide one or more examples. A phrase such as an aspect or some aspects may refer to one or more aspects and vice versa, and this applies similarly to other foregoing phrases.

A reference to an element in the singular is not intended to mean "one and only one" unless specifically stated, but rather "one or more." The term "some" refers to one or more. Underlined and/or italicized headings and subheadings are used for convenience only, do not limit the subject technology, and are not referred to in connection with the interpretation of the description of the subject technology. Relational terms such as first and second and the like may be used to distinguish one entity or action from another without necessarily requiring or implying any actual such relationship or order between such entities or actions. All structural and functional equivalents to the elements of the various configurations described throughout this disclosure that are known or later come to be known to those of ordinary skill in the art are expressly incorporated herein by reference and intended to be encompassed by the subject technology. Moreover, nothing disclosed herein is intended to be dedicated to the public regardless of whether such disclosure is explicitly recited in the above description. No claim element is to be construed under the provisions of 35 U.S.C. § 112, sixth paragraph, unless the element is expressly recited using the phrase "means for" or, in the case of a method claim, the element is recited using the phrase "step for."

While this specification contains many specifics, these should not be construed as limitations on the scope of what may be claimed, but rather as descriptions of particular implementations of the subject matter. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

The subject matter of this specification has been described in terms of particular aspects, but other aspects can be implemented and are within the scope of the following claims. For example, while operations are depicted in the drawings in a particular order, this should not be understood as requiring that such operations be performed in the particular order shown or in sequential order, or that all illustrated operations be performed, to achieve desirable results. The actions recited in the claims can be performed in a different order and still achieve desirable results. As one example, the processes depicted in the accompanying figures do not necessarily require the particular order shown, or sequential order, to achieve desirable results. In certain circumstances, multitasking and parallel processing may be advantageous. Moreover, the separation of various system components in the aspects described above should not be understood as requiring such separation in all aspects, and it should be understood that the described program components and systems can generally be integrated together in a single software product or packaged into multiple software products.

The title, background, brief description of the drawings, abstract, and drawings are hereby incorporated into the disclosure and are provided as illustrative examples of the disclosure, not as restrictive descriptions. It is submitted with the understanding that they will not be used to limit the scope or meaning of the claims. In addition, in the detailed description, it can be seen that the description provides illustrative examples and the various features are grouped together in various implementations for the purpose of streamlining the disclosure. The method of disclosure is not to be interpreted as reflecting an intention that the claimed subject matter requires more features than are expressly recited in each claim. Rather, as the claims reflect, inventive subject matter lies in less than all features of a single disclosed configuration or operation. The claims are hereby incorporated into the detailed description, with each claim standing on its own as a separately claimed subject matter.

The claims are not intended to be limited to the aspects described herein, but are to be accorded the full scope consistent with the language claims and to encompass all legal equivalents. Notwithstanding, none of the claims are intended to embrace subject matter that fails to satisfy the requirements of the applicable patent law, nor should they be interpreted in such a way.

What is claimed is:

1. A computer-implemented method, comprising:
receiving a first list including a plurality of first curves that define a first boundary set;
receiving a second list including a plurality of second curves that define a second boundary set, wherein the plurality of first curves and the plurality of second curves are indicative of one or more features in an integrated circuit based on parametric values;
determining intersections between pairs of curves from the first list and the second list;
assigning a node to each intersection point of a pair of curves;
determining curve sections between the intersections for each intersected curve;
determining, based on a desired Boolean operation, a successor of each curve section;
determining boundaries formed by the curve sections;
performing the desired Boolean operation between two or more boundaries to obtain the one or more features in the integrated circuit from the two or more boundaries;
obtaining a layout of the integrated circuit including the one or more features in the integrated circuit; and
providing the layout to manufacture a mask for reproducing the one or more features in the integrated circuit.

2. The computer-implemented method of claim 1, further comprising:
providing a predetermined distance below which two or more intersections between the pair of curves are considered to correspond to a same node.

3. The computer-implemented method of claim 2, wherein assigning the node to the each intersection point of the pair of curves comprises assigning the node such that two intersection points within the predetermined distance are assigned to the same node.

4. The computer-implemented method of claim 1, wherein determining the curve sections between the intersections comprises:
generating a list of all intersection points on the each intersected curve,
sorting the list in a desired order, and
identifying, for each adjacent pair of intersections in the list that has been sorted, a curve section of an intersected curve as a portion of the intersected curve between a first intersection point and a last intersection point of the intersected curve.

5. The computer-implemented method of claim 4, wherein determining the successor of the each curve section comprises:
determining a signed parameter having a value based on a type of Boolean operation;
determining all pairs of connected curve sections;
for each pair of the connected curve sections, determining an angle between curve tangents at nodes connecting the connected curve sections and determining curvatures of curves at the nodes connecting the connected curve sections;
determining, for each node, a first pair of connected curve sections having a minimum value of the signed parameter;
determining, from the all pairs of the connected curve sections, a second pair of connected sections having a minimum curvature; and
identifying, from the second pair of connected sections having the minimum curvature, one of the second pair of connected curve sections as the successor of the other curve section of the second pair of connected curve sections based on an orientation of the second pair of curve sections.

6. The computer-implemented method of claim 5, further comprising:
ignoring a pair of connected curve sections that includes curve sections that collinearly overlap each other.

7. The computer-implemented method of claim 1, wherein the desired Boolean operations include nested Boolean operations.

8. A system, comprising:
a non-transitory computer readable medium storing computer readable program code; and
one or more processors configured to execute the computer readable program code to configure the system to:
receive a first list including a plurality of first curves that define a first boundary set;
receive a second list including a plurality of second curves that define a second boundary set, wherein the plurality of first curves and the plurality of second curves are indicative of one or more features in an integrated circuit based on parametric values;
determine intersections between pairs of curves from the first list and the second list;
assign a node to each intersection point of a pair of curves;
determine curve sections between the intersections for each intersected curve;
determine, based on a desired Boolean operation, a successor of each curve section;
determine boundaries formed by the curve sections;
perform the desired Boolean operation between two or more boundaries to obtain the one or more features in the integrated circuit from the two or more boundaries; and
generate a layout of the integrated circuit including the one or more features in the integrated circuit, the layout being used to manufacture a mask for reproducing the one or more features in the integrated circuit.

9. The system of claim 8, wherein executing the program code further configures the system to:
receive a predetermined distance below which two or more intersections between the pair of curves are considered to correspond to a same node.

10. The system of claim 9, wherein executing the program code further configures the system to:
assign the node such that two intersection points within the predetermined distance are assigned to the same node.

11. The system of claim 8, wherein executing the program code further configures the system to determine the curve sections between the intersections by:

generating a list of all intersection points on the each intersected curve, sorting the list in a desired order, and identifying, for each adjacent pair of intersections in the list that has been sorted, a curve section of an intersected curve as a portion of the intersected curve between a first intersection point and a last intersection point of the intersected curve.

12. The system of claim 11, wherein executing the program code further configures the system to determine the successor of the each curve section by:

determining a signed parameter having a value based on a type of Boolean operation;

determining all pairs of connected curve sections;

for each pair of the connected curve sections, determining an angle between curve tangents at nodes connecting the connected curve sections and determining curvatures of curves at the nodes connecting the connected curve sections;

determining, for each node, a first pair of connected curve sections having a minimum value of the signed parameter;

determining, from the all pairs of the connected curve sections, a second pair of connected sections having minimum curvature; and identifying, from the second pair of connected sections having the minimum curvature, one of the second pair of connected curve sections as the successor of the other curve section of the second pair of connected curve sections based on an orientation of the second pair of curve sections.

13. The system of claim 12, wherein executing the program code further configures the system to:

disregard a pair of connected curve sections that includes curve sections that collinearly overlap each other.

14. The system of claim 8, wherein executing the program code further configures the system to perform Boolean operations including nested Boolean operations.

15. A non-transitory, computer-readable storage medium comprising computer-readable program code that, when executed by a processor, configures the processor to:

receive a first list including a plurality of first curves that define a first boundary set;

receive a second list including a plurality of second curves that define a second boundary set, wherein the plurality of first curves and the plurality of second curves are indicative of one or more features in an integrated circuit based on parametric values;

determine intersections between pairs of curves from the first list and the second list;

assign a node to each intersection point of a pair of curves;

determine curve sections between the intersections for each intersected curve;

determine, based on a desired Boolean operation, a successor of each curve section;

determine boundaries formed by the curve sections;

perform the desired Boolean operation between two or more boundaries to obtain the one or more features in the integrated circuit from the two or more boundaries; and generate a layout of the integrated circuit including the one or more features in the integrated circuit, the layout being used to manufacture a mask for reproducing the one or more features in the integrated circuit.

16. The non-transitory, computer-readable storage medium of claim 15, wherein executing the computer-readable program code further configures the processor to receive a predetermined distance below which two or more intersections between the pair of curves are considered to correspond to a same node.

17. The non-transitory, computer-readable storage medium of claim 16, wherein executing the computer-readable program code further configures the processor to assign the node such that two intersection points within the predetermined distance are assigned to the same node.

18. The non-transitory, computer-readable storage medium of claim 15, wherein executing the computer-readable program code further configures the processor to determine the curve sections between the intersections by:

generating a list of all intersection points on the each intersected curve, sorting the list in a desired order, and identifying, for each adjacent pair of intersections in the list that has been sorted, a curve section of an intersected curve as a portion of the intersected curve between a first intersection point and a last intersection point of the intersected curve.

19. The non-transitory, computer-readable storage medium of claim 18, wherein executing the computer-readable program code further configures the processor to determine the successor of each curve section by:

determining a signed parameter having a value based on a type of Boolean operation;

determining all pairs of connected curve sections;

for each pair of the connected curve sections, determining an angle between curve tangents at nodes connecting the connected curve sections and determining curvatures of curves at the nodes connecting the connected curve sections;

determining, for each node, a first pair of connected curve sections having a minimum value of the signed parameter;

determining, from the all pairs of the connected curve sections, a second pair of connected sections having a minimum curvature; and identifying, from the second pair of connected sections having the minimum curvature, one of the second pair of connected curve sections as the successor of the other curve section of the second pair of connected curve sections based on an orientation of the curve sections.

20. The non-transitory, computer-readable storage medium of claim 19, wherein executing the computer-readable program code further configures the processor to:

disregard a pair of connected curve sections that includes curve sections that collinearly overlap each other.

* * * * *